US012641962B2

(12) United States Patent
Kang et al.

(10) Patent No.: US 12,641,962 B2
(45) Date of Patent: May 26, 2026

(54) DISPLAY PANEL

(71) Applicant: Samsung Display Co., Ltd., Yongin-si (KR)

(72) Inventors: Jangmi Kang, Yongin-si (KR); Myunghoon Park, Yongin-si (KR); Byungchang Yu, Yongin-si (KR); Dong-Hoon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 303 days.

(21) Appl. No.: 18/492,870

(22) Filed: Oct. 24, 2023

(65) Prior Publication Data

US 2024/0138203 A1     Apr. 25, 2024
US 2024/0237422 A9     Jul. 11, 2024

(30) Foreign Application Priority Data

Oct. 25, 2022    (KR) ........................ 10-2022-0138712

(51) Int. Cl.
| | |
|---|---|
| *H10K 59/12* | (2023.01) |
| *G09G 3/20* | (2006.01) |
| *H10K 50/81* | (2023.01) |
| *H10K 50/82* | (2023.01) |
| *H10K 59/122* | (2023.01) |
| *H10K 59/13* | (2023.01) |
| *H10K 59/131* | (2023.01) |

(Continued)

(52) U.S. Cl.
CPC ......... *H10K 59/122* (2023.02); *H10K 59/131* (2023.02)

(58) Field of Classification Search
CPC .... H10K 59/122; H10K 59/131; H10K 59/88; H10K 59/123; H10K 59/505; H10K 59/87; H10K 59/1213; H10K 59/124; H10K 50/82; H10K 50/81; G09G 3/20; G09G 2320/0257; G09G 2310/0243; G09G 2310/0264
See application file for complete search history.

(56) References Cited

U.S. PATENT DOCUMENTS

| | | |
|---|---|---|
| 8,227,095 B2 | 7/2012 | Kim et al. |
| 8,415,872 B2 | 4/2013 | Choi et al. |

(Continued)

FOREIGN PATENT DOCUMENTS

| | | |
|---|---|---|
| CN | 103280539 | 9/2013 |
| EP | 3 506 361 | 7/2019 |

(Continued)

OTHER PUBLICATIONS

Extended European Search Report for European Application No. 23205878.4, dated Mar. 21, 2024.

*Primary Examiner* — Omar F Mojaddedi

(57) ABSTRACT

A display panel includes a first peripheral upper electrode disposed on an insulating layer in a peripheral area, a second peripheral upper electrode disposed on the insulating layer in the peripheral area and disposed closer to the display area than the first peripheral upper electrode, a display separator disposed between the upper electrode of the first light emitting device and the upper electrode of the second light emitting device, and a peripheral separator disposed between the first peripheral upper electrode and the second peripheral upper electrode to realize superior electrical reliability.

22 Claims, 16 Drawing Sheets

(51) Int. Cl.
  *H10K 59/80* (2023.01)
  *H10K 59/88* (2023.01)

(56) References Cited

U.S. PATENT DOCUMENTS

| | | | |
|---|---|---|---|
| 8,648,337 B2 | 2/2014 | Hsieh | |
| 2015/0162391 A1* | 6/2015 | Kim | H10K 59/122 |
| | | | 257/40 |
| 2017/0338293 A1 | 11/2017 | Guo | |
| 2018/0175009 A1* | 6/2018 | Kim | H01L 25/0753 |
| 2018/0269267 A1* | 9/2018 | Ohchi | H10K 59/124 |
| 2019/0207150 A1* | 7/2019 | Kwon | H10K 59/123 |
| 2020/0235172 A1* | 7/2020 | Lee | G06F 3/0443 |
| 2021/0066419 A1 | 3/2021 | Byun et al. | |

FOREIGN PATENT DOCUMENTS

| | | |
|---|---|---|
| EP | 4 024 468 | 7/2022 |
| KR | 10-1609275 | 4/2016 |
| KR | 10-1699911 | 1/2017 |

* cited by examiner

DISPLAY PANEL

CROSS-REFERENCE TO RELATED APPLICATIONS

This U.S. non-provisional patent application claims priority to and benefits of Korean Patent Application No. 10-2022-0138712 under 35 U.S.C. § 119, filed in the Korean Intellectual Property Office (KIPO) on Oct. 25, 2022, the entire contents of which are hereby incorporated by reference.

BACKGROUND

The disclosure herein relates to a display panel, and more specifically, to a display panel including a separator.

The multimedia electronic apparatuses such as televisions, mobile phones, tablet computers, navigators, game consoles, and the like includes a display panel for displaying an image.

The display panel includes a light emitting device and a circuit for driving the light emitting device. The light emitting device provided in the display panel emit light according to a voltage applied from the circuit to generate an image. To improve reliability of the display panel, research on connection between the light emitting device and the circuit is being conducted.

SUMMARY

The disclosure provides a display panel in which after-image defects are improved, a lifespan is improved, and electrical reliability is improved.

The technical objectives to be achieved by the disclosure are not limited to those described herein, and other technical objectives that are not mentioned herein would be clearly understood by a person skilled in the art from the description of the disclosure.

An embodiment of the disclosure provides a display panel includes a display area and a peripheral area adjacent to the display area, first and second light emitting devices, each of which includes a lower electrode, an upper electrode disposed on the lower electrode, and an emitting layer disposed between the lower electrode and the upper electrode; a first pixel including a first driving transistor electrically connected to the upper electrode of the first light emitting device; a second pixel including a second driving transistor electrically connected to the upper electrode of the second light emitting device; an insulating layer disposed on the first driving transistor and the second driving transistor; a first peripheral upper electrode disposed on the insulating layer in the peripheral area; a second peripheral upper electrode disposed on the insulating layer in the peripheral area and disposed closer to the display area than the first peripheral upper electrode; a display separator disposed between the upper electrode of the first light emitting device and the upper electrode of the second light emitting device; and a peripheral separator disposed between the first peripheral upper electrode and the second peripheral upper electrode.

In an embodiment, the peripheral separator may have a closed-line shape that surrounds the display area in a plan view.

In an embodiment, the peripheral separator may include a plurality of sub-peripheral separators, each of which has the closed-line shape that surrounds the display area in a plan view.

In an embodiment, the display panel may further include, a connection separator disposed between the display separator and the peripheral separator to connect the display separator to the peripheral separator.

In an embodiment, the display panel may further include a connection wiring disposed below the insulating layer to electrically connect the first driving transistor of the first pixel to the upper electrode of the first light emitting device.

In an embodiment, the display panel may further include a lower insulating layer disposed between the first driving transistor of the first pixel and the connection wiring, wherein the first driving transistor of the first pixel and the connection wiring may be electrically connected to each other through a contact hole passing through the lower insulating layer.

In an embodiment, the upper electrode of the first light emitting device may be electrically connected to the connection wiring through an opening defined in the insulating layer. The connection wiring may include a first layer, a second layer disposed on the first layer, and a third layer disposed on the second layer, the first and third layers comprising a same material, wherein an edge of each of the first and the third layers may protrude more than an edge of the second layer, and the upper electrode of the first pixel may be in contact with a side surface of the second layer of the connection wiring.

In an embodiment, the lower electrode may be electrically connected to the first peripheral upper electrode.

In an embodiment, the lower electrode of the first light emitting device and the lower electrode of the second light emitting device may be electrically connected to each other.

In an embodiment, the display panel may further include a power line disposed in the peripheral area, wherein the power line may be electrically connected to the lower electrode through the first peripheral upper electrode.

In an embodiment of the disclosure, a display panel includes a display area and a peripheral area adjacent to the display area, an insulating layer; a plurality of light emitting devices, each of which includes a lower electrode on the insulating layer, an upper electrode disposed on the lower electrode, and an emitting layer disposed between the lower electrode and the upper electrode; a plurality of driving transistors disposed below the insulating layer; a plurality of connection wirings which are disposed between the plurality of driving transistors and the insulating layer to electrically connect each of the plurality of light emitting devices to each of the plurality of driving transistors and each of which includes a circuit connection part electrically connected to the plurality of driving transistors and an emission connection part electrically connected to the upper electrode; a first peripheral upper electrode disposed on the insulating layer in the peripheral area; a peripheral separator disposed on the insulating layer in the peripheral area and disposed closer to the display area than the first peripheral upper electrode; and a second peripheral upper electrode disposed on the insulating layer in the peripheral area and disposed to be spaced apart from the first peripheral upper electrode with the peripheral separator therebetween.

In an embodiment, the first peripheral upper electrode may be electrically connected to the lower electrode.

In an embodiment, the peripheral separator may have a closed-line shape that surrounds the display area in a plan view.

In an embodiment, the peripheral separator may include a plurality of sub-peripheral separators, each of which has a closed-line shape that surrounds the display area in a plan view.

In an embodiment, the insulating layer may be disposed between the upper electrode and the connection wiring, and an opening is defined in the insulating layer, the connection wiring may include: a first layer; a second layer disposed on the first layer; and a third layer disposed on the second layer, the first and third layers comprising a same material, an edge of each of the first and the third layers may protrude more than an edge of the second layer, and the upper electrode may be in contact with a side surface of the second layer of the connection wiring.

In an embodiment, the display panel may further include a power line disposed in the peripheral area, wherein the power line may be electrically connected to the lower electrode through the first peripheral upper electrode.

In an embodiment of the disclosure, a display panel includes a display area and a peripheral area adjacent to the display area includes: an insulating layer; a plurality of light emitting devices, each of which includes a lower electrode on the insulating layer, an upper electrode disposed on the lower electrode, and an emitting layer disposed between the lower electrode and the upper electrode and which are disposed in the display area; a plurality of transistors electrically connected to each of the plurality of light emitting devices through the upper electrode and disposed below the insulating layer; a first peripheral upper electrode disposed on the insulating layer in the peripheral area and electrically connected to the lower electrode; a second peripheral upper electrode disposed on the insulating layer in the peripheral area and disposed closer to the display area than the first peripheral upper electrode; and a peripheral separator disposed between the first peripheral upper electrode and the second peripheral upper electrode on the insulating layer to divide the first peripheral upper electrode and the second peripheral upper electrode.

In an embodiment, the peripheral separator may have a closed-line shape that surrounds the display area in a plan view.

In an embodiment, the peripheral separator may include a plurality of sub-peripheral separators, each of which has a closed-line shape that surrounds the display area in a plan view.

In an embodiment, the display panel may further include a display separator disposed between the upper electrodes adjacent to each other.

In an embodiment, the display panel may further include a connection separator disposed between the display separator and the peripheral separator to connect the display separator to the peripheral separator.

In an embodiment, the display panel may further include a power line disposed in the peripheral area, wherein the power line may be electrically connected to the lower electrode through the first peripheral upper electrode.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings:

FIG. 1 is a schematic block diagram of a display device according to an embodiment of the disclosure;

DETAILED DESCRIPTION OF THE EMBODIMENTS

Figure 2A:
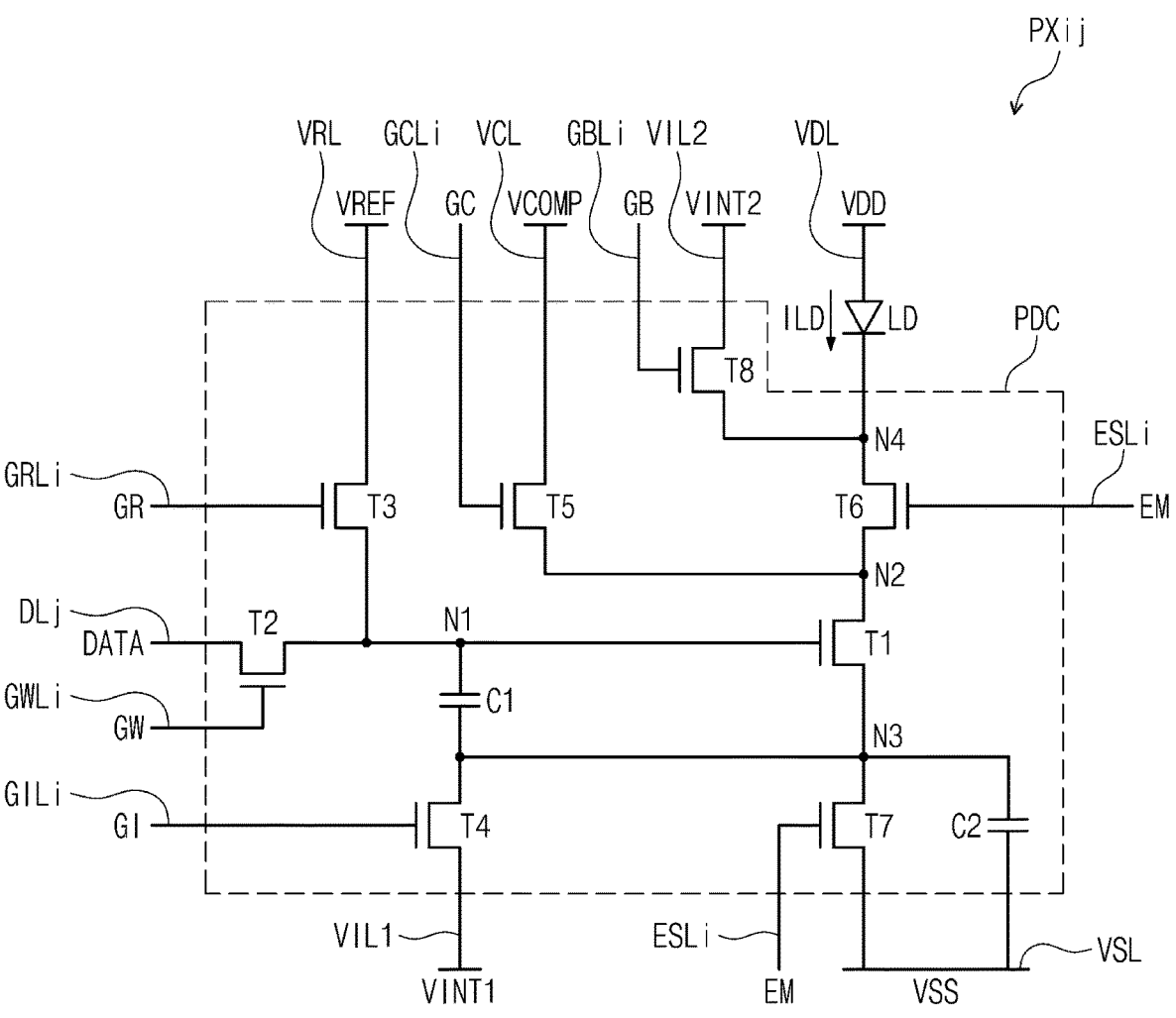
FIG. 2A is a schematic diagram of an equivalent circuit of a pixel according to an embodiment of the disclosure.

When an element is referred to as being "on," "connected to," or "coupled to" another element, it may be directly on, connected to, or coupled to the other element or intervening elements or layers may be present. When, however, an element is referred to as being "directly on," "directly connected to," or "directly coupled to" another element, there are no intervening elements or layers present. To this end, the term "connected" may refer to physical, electrical, and/or fluid connection, with or without intervening elements.

Like reference numerals and/or reference characters refer to like elements throughout. Also, in the figures, the thickness, ratio, and dimensions of components may be exaggerated for clarity of illustration.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

It will be understood that although the terms such as "first" and "second" are used herein to describe various elements, these elements should not be limited by these terms. These terms are used only to distinguish one component from other components. For example, a first element referred to as a first element in an embodiment can be referred to as a second element in another embodiment without departing from the scope of the appended claims.

The terms of a singular form may include plural forms unless referred to the contrary.

Also, "under," "below," "on," "above," and the like are used for explaining relation association of the elements illustrated in the drawings. The terms may be a relative concept and described based on directions expressed in the drawings.

The meaning of "include," "comprise," or "have" specifies a property, a fixed number, a process, an operation, an element, a component or a combination thereof, but does not exclude other properties, fixed numbers, processes, operations, elements, components or combinations thereof.

Unless otherwise defined or implied herein, all terms (including technical and scientific terms) used herein have the same meaning as commonly understood by a person of ordinary skill in the art to which the disclosure belongs. In addition, terms such as those defined in commonly used dictionaries should be interpreted as having a meaning consistent with the meaning in the context of the related technology, and unless explicitly defined here, the terms should not be interpreted as excessively ideal or formal sense.

Hereinafter, embodiments of the disclosure will be described with reference to the accompanying drawings.

Figure 1:
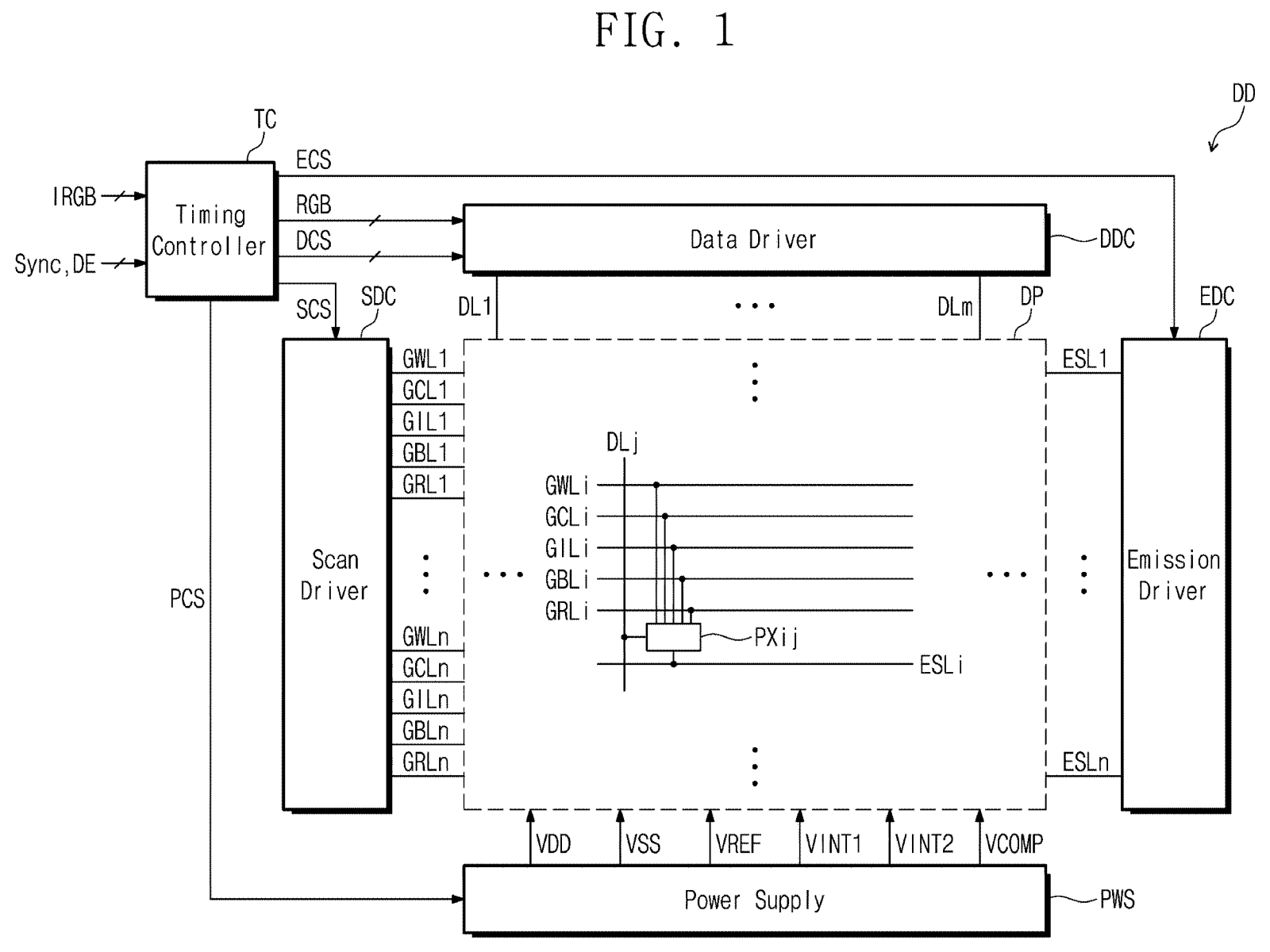

FIG. 1 is a schematic block diagram of a display device according to an embodiment of the disclosure. Referring to FIG. 1, a display device DD may include a display panel DP, panel drivers SDC, EDC, and DDC, a power supply PWS, and a timing controller TC. In this embodiment, the display panel DP may be described as an emission-type display panel. The emission-type display panel may be at least one of various panels including an organic light-emitting display panel, an inorganic light-emitting display panel, and a quantum dot light-emitting display panel. In an embodiment to be described below, an organic light-emitting display panel will be described in detail as an example. The panel driver may include a scan driver SDC, an emission driver EDC, and a data driver DDC.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. The display panel DP may include pixels electrically connected to the scan lines GWL1 to GWLn, GCL1 to GCLn, GIL1 to GILn, GBL1 to GBLn, and GRL1 to GRLn, the emission lines ESL1 to ESLn, and the data lines DL1 to DLm. (Here, m and n are integers greater than 1.)

For example, a pixel PXij (where i and j are integers greater than or equal to 1) disposed on an i-th horizontal line (or an i-th pixel row) and a j-th vertical line (or a j-th pixel column) may be electrically connected to an i-th first scan line GWLi (or write scan line), an i-th second scan line GCLi (or compensation scan line), an i-th third scan line GILi (or first initialization scan line), an i-th fourth scan line GBLi (or second initialization scan line), an i-th fifth scan line GRLi (or reset scan line), a j-th data line DLj, and an i-th emission line ESLi.

The pixel PXij may include light emitting devices, transistors, and capacitors. The pixel PXij may receive a first power supply voltage VDD, a second power supply voltage VSS, a third power supply voltage VREF (or reference voltage), a fourth power supply voltage VINT1 (or first initialization voltage), a fifth power supply voltage VINT2 (or second initialization voltage), and a sixth power supply voltage VCOMP (or compensation voltage) through the power supply PWS.

A voltage value of each of the first power supply voltage VDD and the second power supply voltage VSS may be set so that current flows through the light emitting device to emit light. For example, the first power supply voltage VDD may be set to a voltage higher than the second power supply voltage VSS.

The third power supply voltage VREF may be a voltage for initializing a gate of a driving transistor provided in the pixel PXij. The third power supply voltage VREF may be used to implement a grayscale (e.g., a predetermined or selectable grayscale) by using a voltage difference with a data signal. For this, the third power supply voltage VREF may be set to a voltage (e.g., a predetermined or selectable voltage) within a voltage range of the data signal.

The fourth power supply voltage VINT1 may be a voltage for initializing a capacitor provided in the pixel PXij. The fourth power supply voltage VINT1 may be set to a voltage lower than the third power supply voltage VREF. For example, the fourth power supply voltage VINT1 may be set to a voltage lower than a difference between the third power supply voltage VREF and the threshold voltage of the driving transistor. However, an embodiment of the disclosure is not limited thereto.

The fifth power supply voltage VINT2 may be a voltage for initializing a cathode of the light emitting device provided in the pixel PXij. The fifth power supply voltage VINT2 may be set to a voltage lower than the first power supply voltage VDD or the fourth power supply voltage VINT1 or may be set to a voltage that is similar to (or close to) or equal to the third power supply voltage VREF, but is not limited thereto. The fifth power supply voltage VINT2 may be set to a voltage that is similar to or equal to the first power supply voltage VDD.

The sixth power supply voltage VCOMP may supply a current (e.g., a predetermined or selectable current) to the driving transistor when compensating for a threshold voltage of the driving transistor.

FIG. 1 illustrates that all of the first to sixth power supply voltages VDD, VSS, VREF, VINT1, VINT2, and VCOMP are supplied from the power supply PWS, but the embodiment of the disclosure is not limited thereto. For example, all of the first power supply voltage VDD and the second power supply voltage VSS may be supplied regardless of the structure of the pixel PXij, and at least one voltage of the third power supply voltage VREF, the fourth power supply voltage VINT1, the fifth power supply voltage VINT2, and the sixth power supply voltage VCOMP may not be supplied to correspond to the structure of the pixel PXij.

In an embodiment of the disclosure, signal lines electrically connected to the pixel PXij may be set variously to correspond to the circuit structure of the pixel PXij.

The scan driver SDC may receive a first control signal SCS from a timing controller TC and may supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn based on the first control signal SCS.

The scan signal may be set to a voltage at which the transistors receiving the scan signal may be turned on. For example, a scan signal supplied to a P-type transistor may be set to a logic low level, and a scan signal supplied to an N-type transistor may be set to a logic high level. Hereinafter, the meaning of the phrase "the scan signal is supplied" may be understood as that the scan signal is supplied with a logic level that turns on the transistor controlled thereby.

For convenience of description, FIG. 1 illustrates that the scan driver SDC is a single configuration, but the embodiment of the disclosure is not limited thereto. According to an embodiment, scan drivers may be provided to supply the scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The emission driver EDC may supply a light emitting signal to the emission lines ESL1 to ESLn based on a second control signal ECS. For example, the light emitting signal may be sequentially supplied to the emission lines ESL1 to ESLn.

The transistors electrically connected to the emission lines ESL1 to ESLn of the disclosure may be configured as N-type transistors. The light emitting signal supplied to the emission lines ESL1 to ESLn may be set to a gate-on voltage. The transistors receiving the light emitting signal may be turned on in case that the light emitting signal is supplied, and may be turned off in other cases.

The second control signal ECS may include an emission start signal and clock signals, and the emission driver EDC may be implemented as a shift register that sequentially generates and outputs an emission signal having a pulse form by sequentially shifting the emission start signal having the pulse form by using the clock signals.

The data driver DDC may receive a third control signal DCS and image data RGB (or digital image data) from the timing controller TC. The data driver DDC may convert the digital image data RGB into an analog data signal (e.g., a data signal). The data driver DDC may supply data signals to the data lines DL1 to DLm in response to the third control signal DCS.

The third control signal DCS may include a data enable signal, a horizontal start signal, and a data clock signal, which instruct an output of a valid data signal. For example, the data driver DDC may include a shift register that generates a sampling signal by shifting the horizontal start signal in synchronization with the data clock signal, a latch that latches image data RGB in response to a sampling signal, a digital-to-analog converter (or decoder) that converts the latched image data (e.g., digital data) into analog data signals, and buffers (or amplifiers) that output data signals to the data lines DL1 to DLm.

The power supply PWS may supply the first power supply voltage VDD, the second power supply voltage VSS, and the third power supply voltage VREF, which drive the pixel PXij, to the display panel DP. The power supply PWS may supply at least one of the fourth power supply voltage VINT1, the fifth power supply voltage VINT2, and the sixth power supply voltage VCOMP to the display panel DP.

For example, the power supply PWS may supply the first power supply voltage VDD, the second power supply voltage VSS, the third power supply voltage VREF, the fourth power supply voltage VINT1, the fifth power supply voltage VINT2, and the sixth power supply voltage VCOMP to the display panel DP via a first power line VDL (see FIG. 2A), a second power line VSL (see FIG. 2A), a third power line VRL (or reference voltage line) (see FIG. 2A), a fourth power line (or first initialization voltage line VIL1) (see FIG. 2A), a fifth power line VIL2 (or second initialization voltage line) (see FIG. 2A), and a sixth power line VCL (or compensation voltage line) (see FIG. 2A).

The power supply PWS may be implemented as a power management integrated circuit, but is not limited thereto.

The timing controller TC may generate the first control signal SCS, the second control signal ECS, the third control signal DCS, and a fourth control signal PCS based on an input image data IRGB, a synchronization signal Sync (e.g., vertical synchronization signal, horizontal synchronization signal, etc.), a data enable signal DE, clock signal, etc. The first control signal SCS may be supplied to the scan driver SDC. The second control signal ECS may be supplied to the emission driver EDC. The third control signal DCS may be supplied to the data driver DDC. The fourth control signal PCS may be supplied to the power supply PWS. The timing controller TC may rearrange the input image data IRGB to correspond to the arrangement of the pixels PXij in the display panel DP, thereby generating the image data RGB (or frame data).

The scan driver SDC, the emission driver EDC, the data driver DDC, the power supply PWS, and/or the timing controller TC may be provided directly on the display panel DP or provided in the form of a separate driving chip so as to be electrically connected to the display panel DP. At least two of the scan driver SDC, the emission driver EDC, the data driver DDC, the power supply PWS, and the timing controller TC may be provided as a driving chip. For example, the data driver DDC and the timing controller TC may be provided as a driving chip.

In the above, the display device DD according to an embodiment has been described with reference to FIG. 1, but the display device according to the disclosure is not limited thereto. The signal lines may be further added or omitted according to the configuration of the pixels. Also, a connection relationship between a pixel and the signal lines may be changed. In case that one of the signal lines is omitted, another signal line may replace the omitted signal line.

Figure 2B:
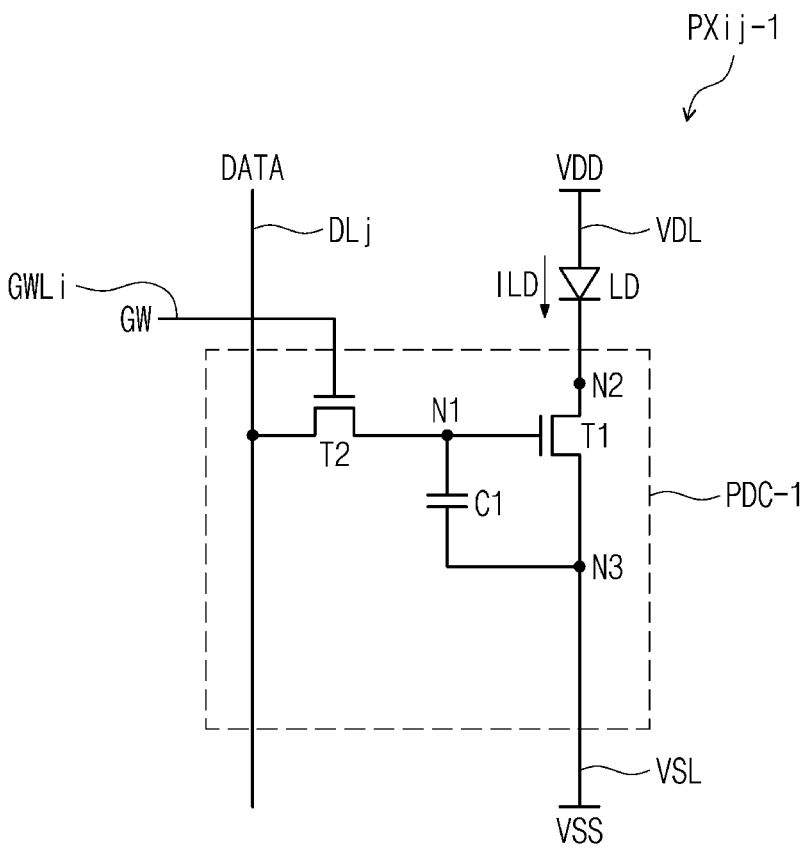
FIG. 2B is a schematic diagram of an equivalent circuit of a pixel according to an embodiment of the disclosure.

FIGS. 2A and 2B are schematic diagrams of equivalent circuits of the pixel according to an embodiment of the disclosure. FIGS. 2A and 2B illustrate, as an example, schematic diagrams of equivalent circuits of the pixels PXij and PXij−1 electrically connected to the i-th first scan line GWLi (hereinafter referred to as a first scan line) and electrically connected to the j-th data line DLj (hereinafter referred to as a data line).

As illustrated in FIG. 2A, the pixel PXij includes a light emitting device LD and a pixel driver PDC. The light emitting device LD may be electrically connected to the first power line VDL and the pixel driver PDC.

The pixel driver PDC may be electrically connected to the scan lines GWLi, GCLi, GILi, GBLi, and GRLi, the data line DLj, the emission line ESLi, and the power lines VDL, VSL, VIL1, VIL2, VRL, and VCL. The pixel driver PDC may include first to eighth transistors T1, T2, T3, T4, T5, T6, T7, and T8, a first capacitor C1, and a second capacitor C2. Hereinafter, a case in which each of the first to eighth transistors T1, T2, T3, T4, T5, T6, T7, and T8 is an N-type transistor will be described as an example. However, the embodiment of the disclosure is not limited thereto, and some of the first to eighth transistors T1 to T8 may be N-type transistors, the others may be P-type transistors, or each of the first to eighth transistors T1 to T8 may be a P-type transistor, but the disclosure is not limited to any one embodiment.

A gate of the first transistor T1 may be electrically connected to a first node N1. A first electrode of the first transistor T1 may be electrically connected to a second node N2, and a second electrode of the first transistor T1 may be electrically connected to a third node N3. The first transistor T1 may be a driving transistor. The first transistor T1 may control a driving current ILD flowing from the first power line VDL to the second power line VSL via the light emitting device LD in response to a voltage of the first node N1. The first power supply voltage VDD may be set to a voltage having a potential higher than that of the second power supply voltage VSS.

In this specification, in case that a transistor and a signal line are "electrically connected," a source, a drain, and a gate of the transistor and the signal line may have an integral shape or may be electrically connected through a connection electrode."

The second transistor T2 may include a gate electrically connected to the write scan line GWLi, a first electrode electrically connected to the data line DLj, and a second electrode electrically connected to the first node N1. The second transistor T2 may supply a data signal DATA to the first node N1 in response to a write scan signal GW transmitted through the write scan line GWLi. The second transistor T2 may be turned on in case that the write scan signal GW is supplied to the write scan line GWLi, to electrically connect the data line DLj to the first node N1.

The third transistor T3 may be electrically connected between the first node N1 and the reference voltage line VRL. A first electrode of the third transistor T3 may receive the reference voltage VREF through the reference voltage line VRL, and a second electrode of the third transistor T3 may be electrically connected to the first node N1. In this embodiment, a gate of the third transistor T3 may receive a reset scan signal GR through the i-th fifth scan line GRLi (hereinafter referred to as a fifth scan line). The third transistor T3 may be turned on in case that the reset scan signal GR is supplied to the reset scan line GRLi, to provide the reference voltage VREF to the first node N1.

The fourth transistor T4 may be electrically connected between the third node N3 and the first initialization voltage line VIL1. A first electrode of the fourth transistor T4 may be electrically connected to the third node N3, and a second electrode of the fourth transistor T4 may be electrically connected to the first initialization voltage line VIL1 providing the first initialization voltage VINT1. The fourth transistor T4 may be referred to as a first initialization transistor. A gate of the fourth transistor T4 may receive a first initialization scan signal GI through the i-th third scan line GILi (hereinafter referred to as a third scan line). The fourth transistor T4 may be turned on in case that the first initialization scan signal GI is supplied to the first initialization scan line GILi, to supply the first initialization voltage VINT1 to the third node N3.

The fifth transistor T5 may be electrically connected between the compensation voltage line VCL and the second node N2. A first electrode of the fifth transistor T5 may receive the compensation voltage VCOMP through the compensation voltage line VCL, and a second electrode of the fifth transistor T5 may be electrically connected to the second node N2 so as to be electrically connected to the first electrode of the first transistor T1. A gate of the fifth transistor T5 may receive a compensation scan signal GC through the i-th second scan line GCLi (hereinafter referred to as a second scan line). The fifth transistor T5 may be turned on in case that the compensation scan signal GC is supplied to the compensation scan line GCLi, to provide the compensation voltage VCOMP to the second node N2, and thus, a threshold voltage of the first transistor T1 may be compensated for during a compensation period.

The sixth transistor T6 may be electrically connected between the first transistor T1 and the light emitting device LD. A gate of the sixth transistor T6 may receive a light emitting signal EM through the i-th emission line ESLi (hereinafter referred to as an emission line). A first electrode of the sixth transistor T6 may be electrically connected to a cathode of the light emitting device LD through the fourth node N4, and a second electrode of the sixth transistor T6 may be electrically connected to the first electrode of the first transistor T1 through the second node N2. The sixth transistor T6 may be referred to as a first emission control transistor. In case that the light emitting signal EM is supplied to the emission line ESLi, the sixth transistor T6 may be turned on to electrically connect the light emitting device LD to the first transistor T1.

The seventh transistor T7 may be electrically connected between the second power line VSL and the third node N3. A first electrode of the seventh transistor T7 may be electrically connected to the second electrode of the first transistor T1 through the third node N3, and a second electrode of the seventh transistor T7 may receive the second power supply voltage VSS through the second power line VSL. A gate of the seventh transistor T7 may be electrically connected to the emission line ESLi. The seventh transistor T7 may be referred to as a second emission control transistor. In case that the light emitting signal EM is supplied to the emission line ESLi, the seventh transistor T7 may be turned on to electrically connect the second electrode of the first transistor T1 to the second power line VSL.

In this embodiment, the sixth transistor T6 and the seventh transistor T7 may be electrically connected to a same emission line ESLi and turned on through a same emission signal EM, but this is merely an example. For example, the sixth transistor T6 and the seventh transistor T7 may be independently turned on by different signals that are distinguished from each other. In the pixel driver PDC according to an embodiment, either the sixth transistor T6 or the seventh transistor T7 may be omitted.

The eighth transistor T8 may be electrically connected between the second initialization voltage line VIL2 and the fourth node N4. For example, the eighth transistor T8 may include a gate electrically connected to the i-th fourth scan line GBLi (hereinafter referred to as a fourth scan line), a first electrode electrically connected to the second initialization voltage line VIL2, and a second electrode electrically connected to a fourth node N4. The eighth transistor T8 may be referred to as a second initialization transistor. The eighth transistor T8 may supply the second initialization voltage VINT2 corresponding to the fourth node N4 corresponding to the cathode of the light emitting device LD in response to a second initialization scan signal GB transmitted through the second initialization scan line GBLi. The cathode of the light emitting device LD may be initialized by the second initialization voltage VINT2.

In this embodiment, some of the second to eighth transistors T2, T3, T4, T5, T6, T7, and T8 may be simultaneously turned on through a same scan signal. For example, the eighth transistor T8 and the fifth transistor T5 may be simultaneously turned on through a same scan signal. For example, the eighth transistor T8 and the fifth transistor T5 may operate by a same compensation scan signal GC. The eighth transistor T8 and the fifth transistor T5 may be simultaneously turned on/off by a same compensation scan signal GC. The compensation scan line GCLi and the second initialization scan line GBLi may be substantially provided as a single scan line. Thus, the initialization of the cathode of the light emitting device LD and the compensation of the threshold voltage of the first transistor T1 may be performed at a same timing. However, this is merely an example and is not limited to an embodiment.

According to an embodiment of the disclosure, the initialization of the cathode of the light emitting device LD and the compensation of the threshold voltage of the first transistor T1 may be performed by applying a same power supply voltage. For example, the compensation voltage line VCL and the second initialization voltage line VIL2 may be substantially provided as a single power supply line. The initialization operation of the cathode and the compensation operation of the driving transistor may be performed at a power supply voltage, and thus, a design of the driver may be simplified. However, this is merely an example, and in an embodiment of the disclosure, it is not limited to an embodiment.

The first capacitor C1 may be disposed between the first node N1 and the third node N3. The first capacitor C1 may store a difference voltage between the first node N1 and the third node N3. The first capacitor C1 may be referred to as a storage capacitor.

The second capacitor C2 may be disposed between the third node N3 and the second power line VSL. For example, an electrode of the second capacitor C2 may be electrically connected to the second power line VSL receiving the second power supply voltage VSS, and another electrode of the second capacitor C2 may be electrically connected to the third node N3. The second capacitor C2 may store a charge corresponding to a voltage difference between the second power supply voltage VSS and the second node N2. The second capacitor C2 may be referred to as a hold capacitor. The second capacitor C2 may have a storage capacity greater than that of the first capacitor C1. Thus, the second capacitor C2 may minimize a voltage change of the third node N3 in response to a voltage change of the first node N1.

In this embodiment, the light emitting device LD may be electrically connected to the pixel driver PDC through the fourth node N4. The light emitting device LD may include an anode electrically connected to the first power line VDL and a cathode opposite to the anode. In this embodiment, the light emitting device LD may be electrically connected to the pixel driver PDC through the cathode. For example, in the pixel PXij according to an embodiment of the disclosure, a connection node at which the light emitting device LD and the pixel driver PDC are electrically connected may be the fourth node N4, and the fourth node N4 may correspond to a connection node between the first electrode of the sixth transistor T6 and the cathode of the light emitting device LD. Thus, a potential of the fourth node N4 may substantially correspond to a potential of the cathode of the light emitting device LD.

The anode of the light emitting device LD may be electrically connected to the first power line VDL to receive the first power supply voltage VDD, which is a constant voltage, and the cathode may be electrically connected to the first transistor T1 through the sixth transistor T6. For example, in this embodiment in which the first to eighth transistors T1 to T8 are N-type transistors, the potential of the third node N3 corresponding to a source of the first transistor T1, which is the driving transistor, may not be directly affected by the characteristics of the light emitting device LD. Therefore, even if the light emitting device LD is deteriorated, an effect on the transistors constituting (or forming) the pixel driver PDC, particularly a gate-source voltage (Vgs) of the driving transistor, may be reduced. For example, since an amount of change in driving current due to the deterioration of the light emitting device LD may be reduced, afterimage defects of the display panel according to an increase in use time may be reduced to improve a lifespan of the display panel.

As another example, as illustrated in FIG. 2B, the pixel PXij-1 may include a pixel driver PDC-1 including two transistors T1 and T2 and one capacitor C1. The pixel driver PDC-1 may be electrically connected to the light emitting device LD, the write scan line GWLi, the data line DLj, and the second power line VSL. The pixel driver PDC-1 illustrated in FIG. 2B may correspond to a case in which the third to eighth transistors T3 to T8 and the second capacitor C2 are omitted in the pixel driver PDC illustrated in FIG. 2A.

Each of the first and second transistors T1 and T2 may be an N-type or a P-type transistor. In this embodiment, each of the first and second transistors T1 and T2 will be exemplarily described as an N-type transistor.

The first transistor T1 may include a gate electrically connected to the first node N1, a first electrode electrically connected to the second node N2, and a second electrode electrically connected to the third node N3. The second node N2 may be a node electrically connected to a side of the first power line VDL, and the third node N3 may be a node electrically connected to a side of the second power line VSL. The first transistor T1 may be electrically connected to the light emitting device LD through the second node N2 and electrically connected to the second power line VSL through the third node N3. The first transistor T1 may be a driving transistor.

The second transistor T2 may include a gate receiving the write scan signal GW through the write scan line GWLi, a first electrode electrically connected to the data line DLj, and a second electrode electrically connected to the first node N1. The second transistor T2 may supply a data signal DATA to the first node N1 in response to the write scan signal GW transmitted through the write scan line GWLi.

The capacitor C1 may include an electrode electrically connected to the first node N1 and an electrode electrically connected to the third node N3. The capacitor C1 may store a data signal DATA transmitted to the first node N1.

The light emitting device LD may include an anode and a cathode. In this embodiment, the anode of the light emitting device LD may be electrically connected to the first power line VDL, and the cathode may be electrically connected to the pixel driver PDC-1 through the second node N2. In this embodiment, the cathode of the light emitting device LD may be electrically connected to the first transistor T1. The light emitting device LD may emit light in response to an amount of current flowing through the first transistor T1 of the pixel driver PDC-1.

In this embodiment in which the first and second transistors T1 and T2 are the N-type transistors, the second node N2 at which the cathode of the light emitting device LD and the pixel driver PDC-1 are electrically connected may correspond to a drain of the transistor T1. In this case, a change in gate-source voltage (Vgs) of the first transistor T1 caused by the light emitting device LD may be prevented. Thus, since an amount of change in driving current due to the deterioration of the light emitting device LD may be reduced, afterimage defects of the display panel due to an increase in use time may be reduced to improve a lifespan of the display panel.

FIGS. 2A and 2B illustrate equivalent circuits for the pixel drivers PDC and PDC-1 according to an embodiment of the disclosure, and in the display panel according to an embodiment of the disclosure, if the circuit is electrically connected to the cathode of the light emitting device LD, the number or arrangement of transistors and the number or arrangement of capacitors may be designed in various manners and are not limited to one embodiment.

Figure 3A:
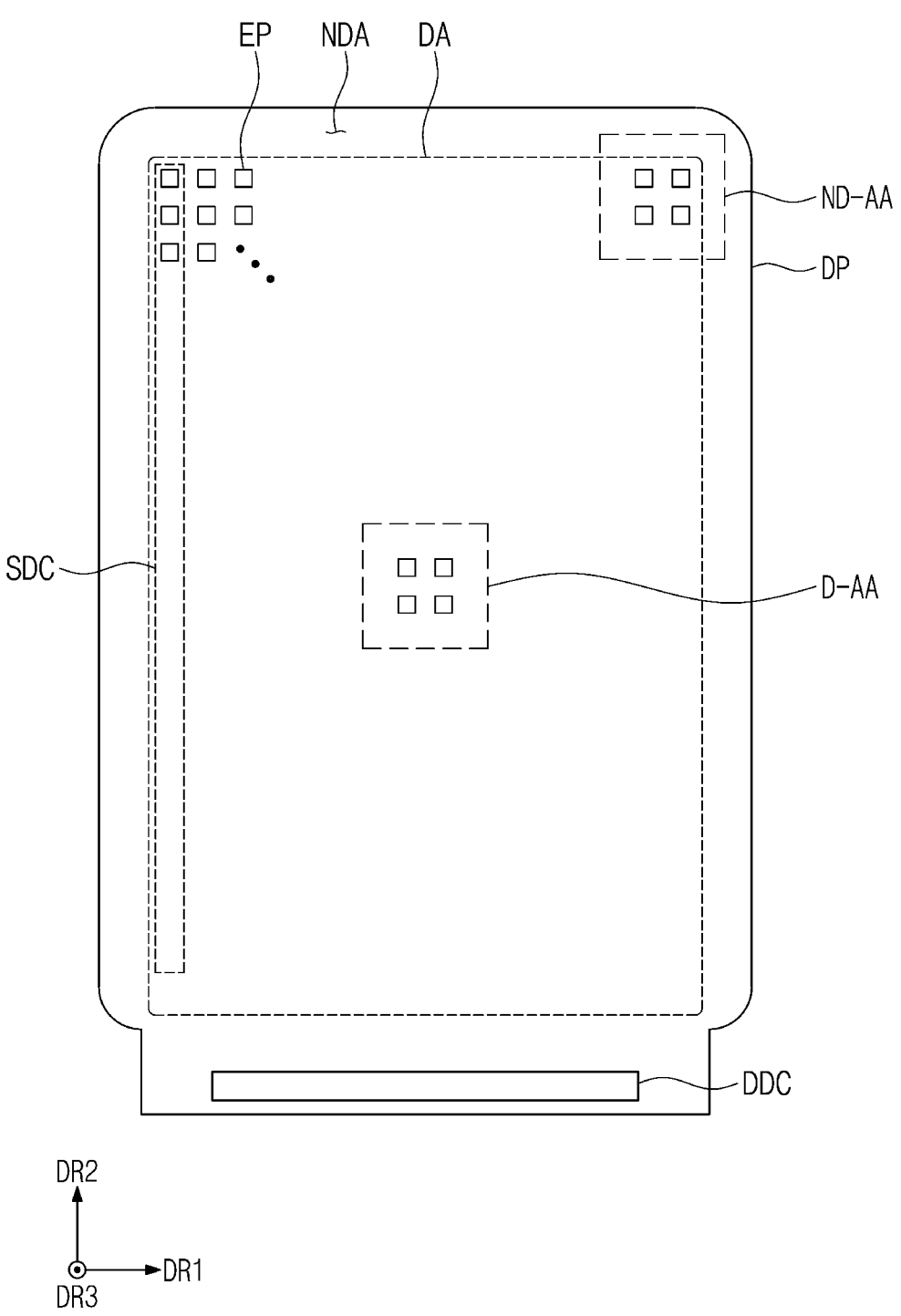
FIG. 3A is a schematic plan view of a display panel according to an embodiment of the disclosure.
Figure 3B:
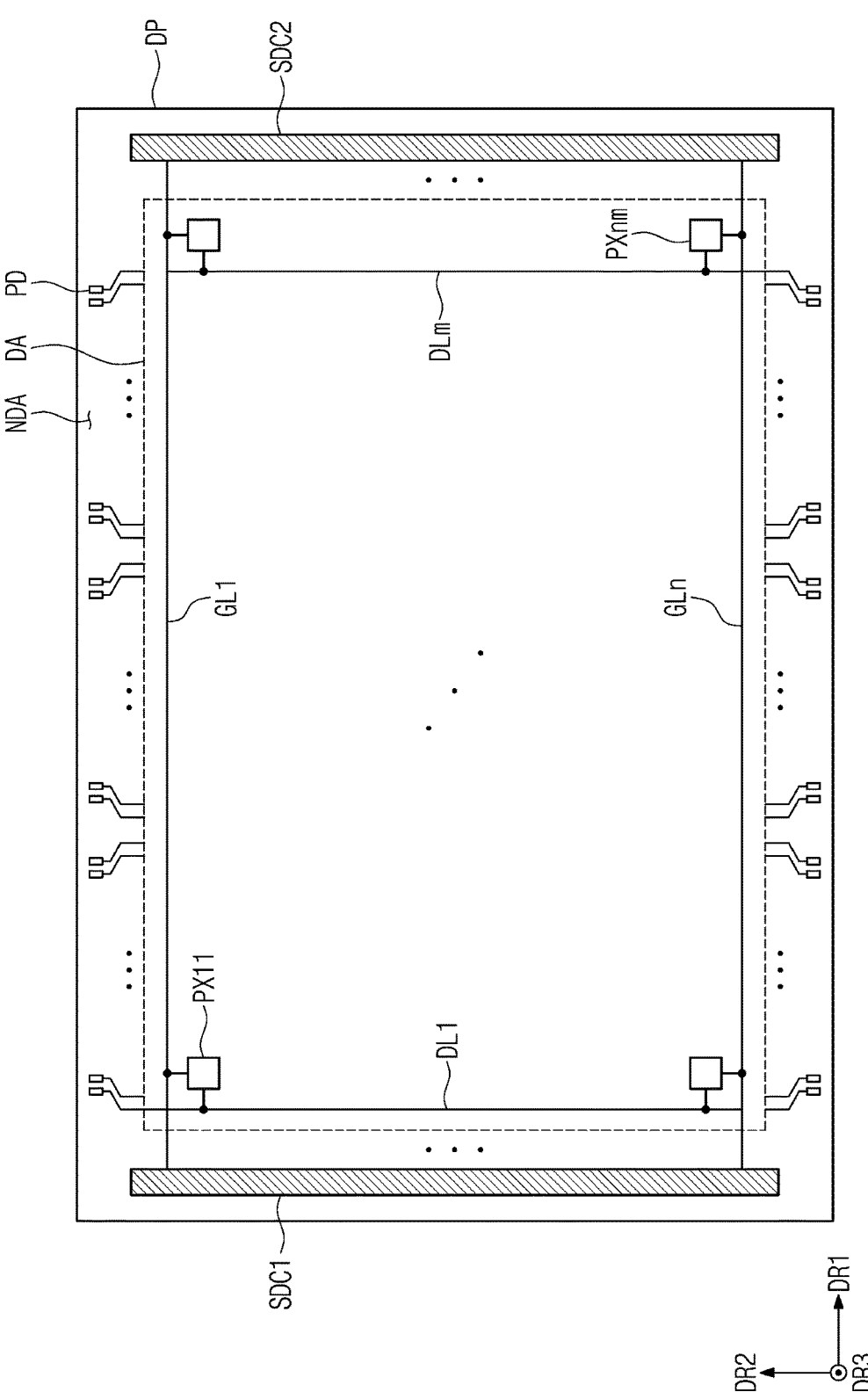
FIG. 3B is a schematic plan view of a display panel according to an embodiment of the disclosure.

FIGS. 3A and 3B are schematic plan views of the display panel according to an embodiment of the disclosure. In each of FIGS. 3A and 3B, some components may be omitted.

Hereinafter, the disclosure will be described with reference to FIGS. 3A and 3B. Referring to FIG. 3A, the display panel DP according to an embodiment may include or may be divided into a display area DA and a peripheral area NDA (or non-display area). The display area DA may include emitting parts EP.

The emitting parts EP may be areas that respectively emit light by the pixels PXij (see FIG. 1). Each of the emitting parts EP may correspond to a light emitting opening OP-PDL to be described below.

The peripheral area NDA may be disposed adjacent to the display area DA. In this embodiment, the peripheral area NDA has a shape surrounding an edge of the display area DA. However, this is merely an example, and the peripheral area NDA may be disposed at a side of the display area DA or may be omitted, and is not limited to one embodiment.

In this embodiment, the scan driver SDC and the data driver DDC may be mounted on the display panel DP. In an embodiment, the scan driver SDC may be disposed in the display area DA, and the data driver DDC may be disposed in the peripheral area NDA. The scan driver SDC may overlap at least a portion of the emitting parts EP disposed in the display area DA on a plane (or in a plan view). As the scan driver SDC is disposed in the display area DA, a surface area of the peripheral area NDA may be reduced when compared to the display panel, in which the scan driver is disposed in the peripheral area according to the related art, and thus, a display device having a thin bezel may be readily implemented.

Unlike illustrated in FIG. 3A, the scan driver SDC may be provided as two scan drivers that are distinguished from each other. The two scan drivers SDC may be spaced apart from each other in a left to right direction with respect to a center of the display area DA. As another example, the scan drivers SDC may be provided in a larger number than two, and are not limited to one embodiment.

FIG. 3A illustrates an example of the display panel, and the data driver DDC may be disposed in the display area DA. Some of the emitting parts EP disposed in the display area DA may overlap the data driver DDC on a plane.

In an embodiment, the data driver DDC may be provided in the form of a separate driving chip independent of the display panel DP and be electrically connected to the display panel DP. However, this is merely an example. As another example, the data driver DDC and the scan driver SDC may be formed in a same process to constitute the display panel DP, and this is not limited to one embodiment.

As illustrated in FIG. 3B, the display panel DP may have a shape in which a length corresponding to the first direction DR1 is greater than a length corresponding to the second direction DR2. The display panel DP may include multiple pixels PX11 to PXnm (here, n and m are integers numbers greater than 1). In this embodiment, the display panel DP may include scan drivers SDC1 and SDC2. FIG. 3B illustrates that the scan drivers SDC1 and SDC2 include a first scan driver SDC1 and a second scan driver SDC2 which are spaced apart from each other in the first direction DR1.

The first scan driver SDC1 may be electrically connected to some of scan lines GL1 to GLn, and the second scan driver SDC2 may be electrically connected to others of the scan lines GL1 to GLn. For example, the first scan driver SDC1 may be electrically connected to odd-numbered scan lines among the scan lines GL1 to GLn, and the second scan driver SDC2 may be electrically connected to even-numbered scan lines among the scan lines GL1 to GLn.

FIG. 3B illustrates pads PD of the data lines DL1 to DLm for ease of description. The pads PD may be defined at ends of the data lines DL1 to DLm. The data lines DL1 to DLm may be electrically connected to the data driver DDC (see FIG. 3A) through the pads PD.

According to an embodiment of the disclosure, the pads PD may be divided and arranged at positions on the peripheral area NDA, which are spaced apart from each other with the display area DA therebetween. For example, some of the pads PD may be disposed at an upper side, e.g., at a side adjacent to the first scan line GL1 among the scan lines GL1 to GLn, and others of the pads PD may be disposed at a lower side, e.g., at a side adjacent to the last scan line GLn among the scan lines GL1 to GLn. In this embodiment, the pads PD electrically connected to the odd-numbered data lines among the data lines DL1 to DLm may be disposed at the upper side, and the pads PD electrically connected to the even-numbered data lines among the data lines DL1 to DLm may be disposed at the lower side.

Although not shown, the display panel DP includes upper data drivers electrically connected to the pads PD disposed at the upper side and/or lower data drivers electrically connected to the pads PD disposed at the lower side. However, this is merely an example, and the display panel DP may include an upper data driver electrically connected to the pads PD disposed at the upper side and/or a lower data driver electrically connected to the pads PD disposed at the lower side. For example, the pads PD according to an embodiment of the disclosure may be disposed at only a side of the display panel DP and thus electrically connected to a single data driver, and are not limited to one embodiment.

As described above with reference to FIG. 3A, in the display panel DP in FIG. 3B, the scan driver and/or a data driver may also be disposed in the display area DA, and thus, some of the emitting parts disposed in the display area DA may overlap the scan driver and/or the data driver on a plane.

Figure 4A:
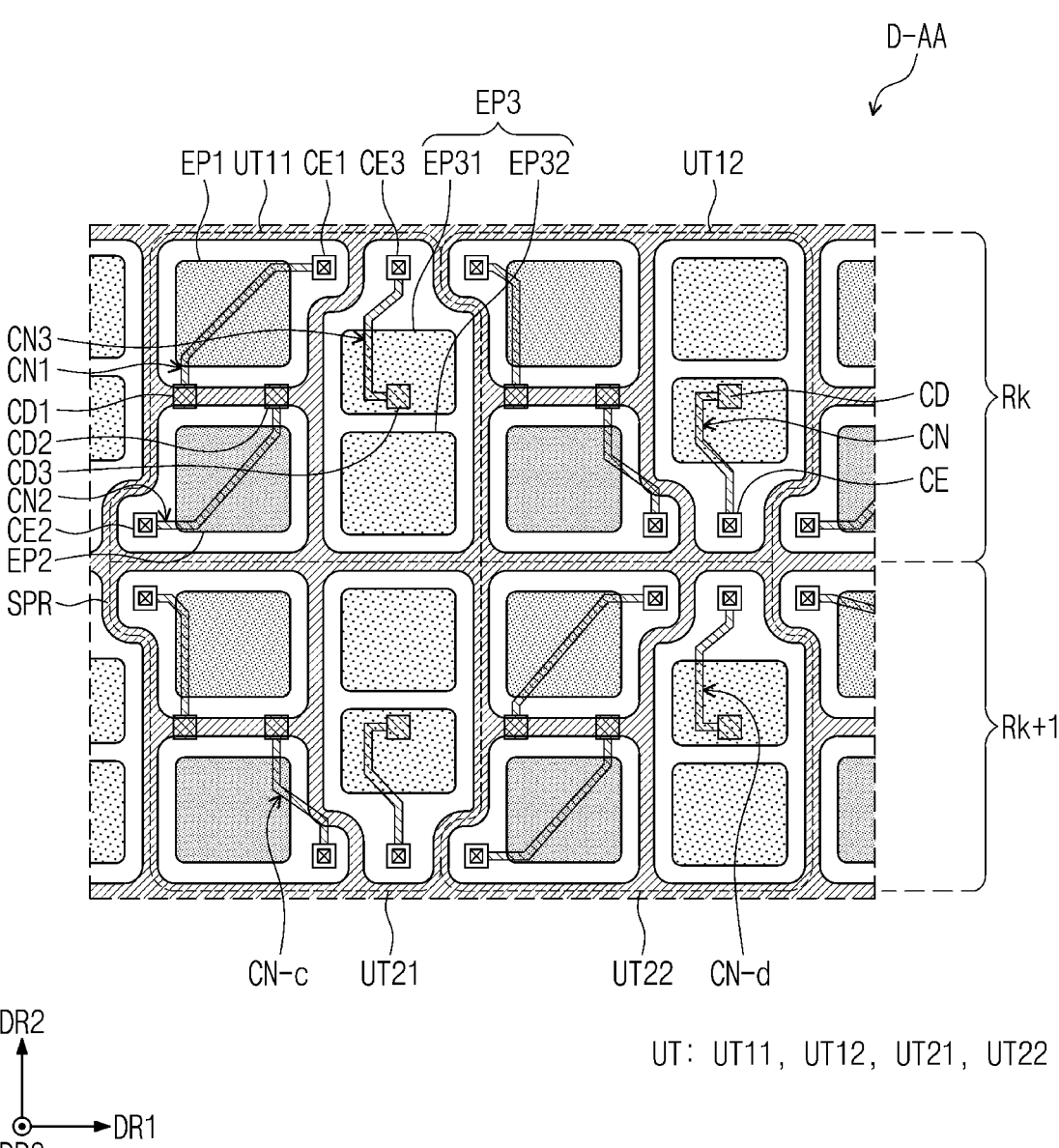
FIG. 4A is a schematic plan view of a display panel according to an embodiment of the disclosure.
Figure 4B:
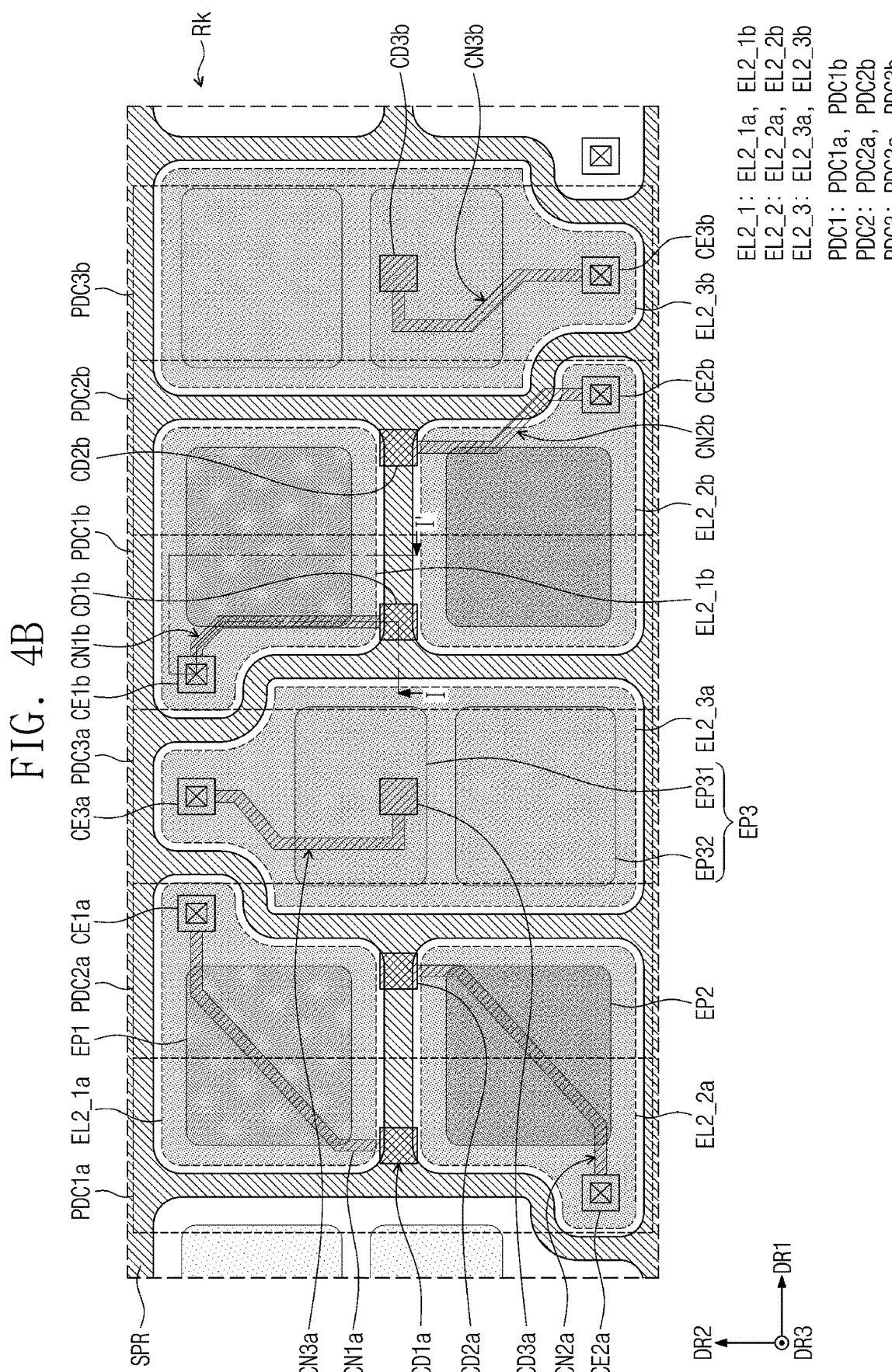
FIG. 4B is a schematic plan view of a display panel according to an embodiment of the disclosure.
Figure 4C:
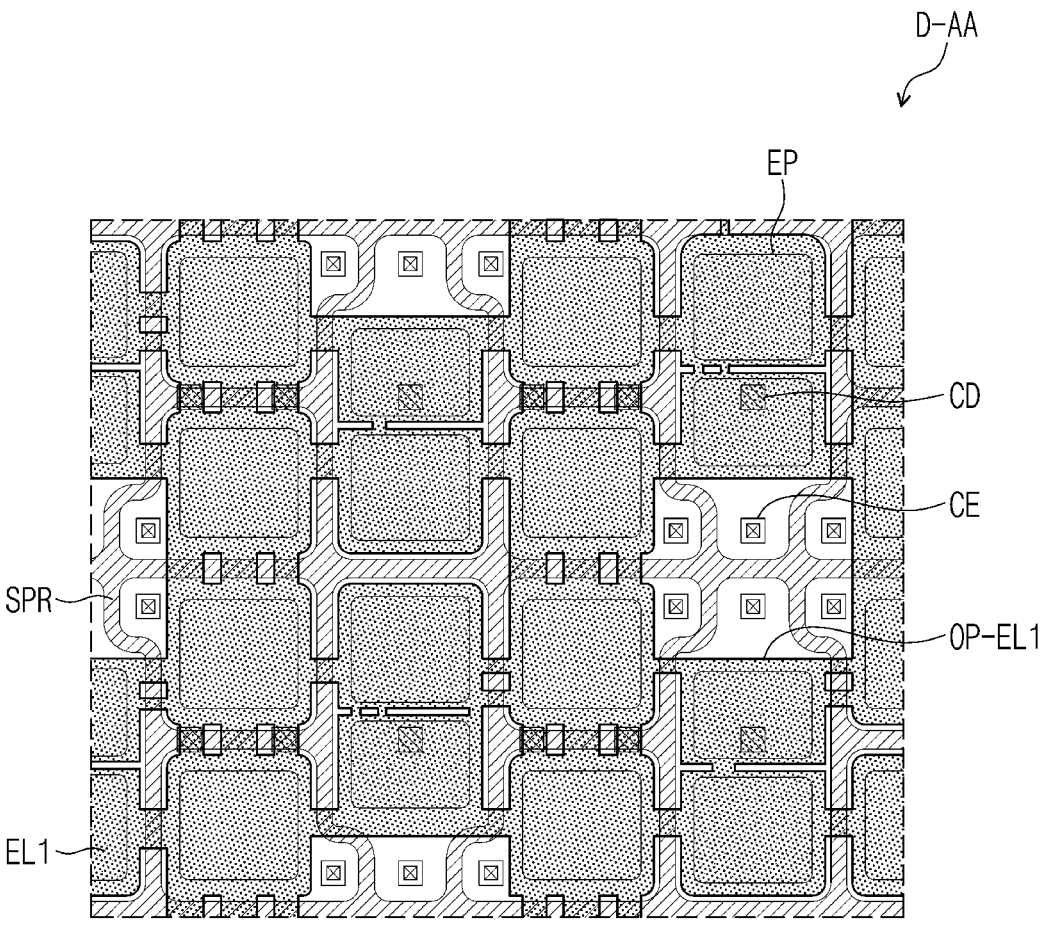
FIG. 4C is a schematic plan view of a display panel according to an embodiment of the disclosure.

FIGS. 4A to 4C are schematic plan views of the display panel according to an embodiment of the disclosure. FIG. 4A is a schematic enlarged plan view illustrating a portion corresponding to an area D-AA illustrated in FIG. 3A and illustrates an area on which a total of four light emitting units UT in two rows and two columns are disposed. FIG. 4B is a schematic enlarged view illustrating an area illustrated in FIG. 4A. In FIG. 4C, some of the components illustrated in FIG. 4A may be omitted or emphasized. Hereinafter, the disclosure will be described with reference to FIGS. 4A to 4C.

FIG. 4A illustrates light emitting units UT11, UT12, UT21, and UT22 in two rows and two columns. The emitting parts in a first row Rk may include the emitting parts constituting a first row first column light emitting unit UT11 and a first row second column light emitting unit UT12, and the emitting parts in a second row Rk+1 may include the emitting parts constituting a second row first column light emitting unit UT21 and a second row second column light emitting unit UT22. FIG. 4B illustrates the emitting parts in the first row Rk. FIGS. 4A to 4C illustrate a separator SPR, emitting parts EP1, EP2, and EP3 disposed on areas partitioned by the separator SPR, connection wirings CN1, CN2, and CN3, a first electrode EL1, and second electrodes EL2_1 (e.g., EL2_1$a$, EL2_1$b$), EL2_2 (e.g., EL2_2$a$, EL2_2$b$), and EL2_3 (e.g., EL2_3$a$, EL2_3$b$) among components of the display panel.

As described above, each of the emitting parts EP1, EP2, and EP3 may correspond to a light emitting opening OP-PDL to be described below. For example, each of the emitting parts EP1, EP2, and EP3 may be an area from which light is emitted by the above-described light emitting device, and may correspond to a unit constituting an image displayed on the display panel DP. More specifically, each of the emitting parts EP1, EP2, and EP3 may correspond to an area defined by the light emitting opening OP-PDL (FIG. 5) to be described below, particularly an area defined by a bottom surface of the light emitting opening OP-PDL.

The emitting parts EP1, EP2, and EP3 may include a first emitting part EP1, a second emitting part EP2, and a third emitting part EP3. The first emitting part EP1, the second emitting part EP2, and the third emitting part EP3 may emit light having colors different from each other. For example, the first emitting part EP1 may emit red light, the second emitting part EP2 may emit green light, and the third emitting part EP3 may emit blue light, but the combination of the colors is not limited thereto. At least two or more of the emitting parts EP1, EP2, and EP3 may emit light having a same color. For example, all of the first to third emitting parts EP1, EP2, and EP3 may emit blue light or emit white light.

In the emitting parts EP1, EP2, and EP3, the third emitting part EP3 displaying light emitted by the third emitting part EP3 may include two sub emitting parts EP31 and EP32 which are spaced apart from each other in the second direction DR2. However, this is merely an example. As another example, the third emitting part EP3 may be provided in a pattern having an integral shape, similar to the other emitting parts EP1 and EP2, and/or at least one of other emitting parts EP1 and EP2 may include sub emitting parts which are spaced apart from each other, but the disclosure is not limited to one embodiment.

In this embodiment, the emitting parts in the first row Rk may include emitting parts in which the first row first column light emitting units UT11 and the first row second column light emitting units UT12 are repeatedly arranged. The emitting parts in the second row Rk+1 may include emitting parts having a shape and arrangement in which the emitting parts in the first row Rk are axisymmetric with respect to an axis parallel to the first direction DR1. Thus, the shape and arrangement of the emitting parts constituting the first row first column light emitting unit UT11 and the first row second column light emitting unit UT12 and connection parts of the connection wirings, which are axisymmetric with respect to the axis parallel to the first direction DR1, may correspond to the emitting parts constituting the second row first column light emitting unit UT21 and the second row second column light emitting unit UT22 and the connection parts of connection wirings.

Hereinafter, the first row first column light emitting unit UT11 will be described. FIG. 4B illustrates second electrodes EL2_1, EL2_2, and EL2_3, pixel drivers PDC, and connection wirings CN for ease of description. The second electrodes EL2_1, EL2_2, and EL2_3 may be electrically disconnected from each other by being separated from each other by the separator SPR. In this embodiment, a light emitting unit UT may include three emitting parts EP1, EP2, and EP3. Thus, the light emitting unit UT may include three second electrodes EL2_1, EL2_2, and EL2_3 (hereinafter referred to as first to third cathodes), three pixel drivers PDC1 (e.g., PDC1a, PDC1b), PDC2 (e.g., PDC2a, PDC2b), and PDC3 (e.g., PDC3a, PDC3b), and three connection wirings CN1, CN2, and CN3. However, this is merely an example, and the number and arrangement of the light emitting units UT may be designed in various manners and are not limited to one embodiment.

The first to third pixel drivers PDC1, PDC2, and PDC3 may be electrically connected to the light emitting devices constituting the first to third emitting parts EP1, EP2, and EP3, respectively. In this specification, "connected" includes not only a case of being physically connected by direct contact, but also a case of being electrically connected.

As illustrated in FIG. 4B, in each area on which the pixel drivers PDC1, PDC2, and PDC3 are defined on a plane may correspond parts in which the transistor and capacitor elements constituting the circuit, e.g., the pixel driver PDC (see FIG. 2) for driving the light emitting device of the pixel are repeatedly arranged.

The first to third pixel drivers PDC1, PDC2, and PDC3 may be sequentially disposed in the first direction DR1. The disposed positions of the first to third pixel drivers PDC1, PDC2, and PDC3 may be independently designed regardless of the positions or shapes of the first to third emitting parts EP1, EP2, and EP3.

For example, the first to third pixel drivers PDC1, PDC2, and PDC3 may be designed to be disposed in an area defined by being partitioned by the separator, e.g., a position different from the position at which the first to third cathodes EL2_1, EL2_2, and EL2_3 are disposed or to have a surface area having a shape different from that of the first to third cathodes EL2_1, EL2_2, and EL2_3. As another example, the first to third pixel drivers PDC1, PDC2, and PDC3 may be designed to be disposed to overlap the positions at which the first to third emitting parts EP1, EP2, and EP3 are present and to be disposed in an area defined by being partitioned by a separator, for example, in a shape having a surface area similar to that of the first to third cathodes EL2_1, EL2_2, and EL2_3.

In this embodiment, FIG. 4B illustrates that each of the first to third pixel drivers PDC1, PDC2, and PDC3 may have a rectangular shape, each of the first to third emitting parts EP1, EP2, and EP3 may have a surface area less than that of each of the first to third pixel drivers PDC1, PDC2, and PDC3 and a shape different from that of each of the first to third pixel drivers PDC1, PDC2, and PDC3, and the first to third cathodes EL2_1, EL2_2, and EL2_3 may be disposed at positions overlapping the first to third emitting parts EP1, EP2, and EP3 and provided in irregular shapes.

Thus, as illustrated in FIG. 4B, the first pixel driver PDC1 may be disposed at a position that partially overlaps the first emitting part EP1, the second emitting part EP2, and other emitting parts adjacent thereto. The second pixel driver PDC2 may be disposed at a position overlapping the first emitting part EP1, the second emitting part EP2, and the third emitting part EP3. The third pixel driver PDC3 may be disposed at a position overlapping the third emitting part EP3. However, this is merely an example, and the positions of the first to third pixel drivers PDC1, PDC2, and PDC3 may be designed in various shapes and arrangements independently of the emitting parts EP1, EP2, and EP3, and are not limited to one embodiment.

The connection wiring CN may be provided in plurality and may be disposed apart from each other. The connection wiring CN may electrically connect the pixel driver to the light emitting device. In detail, the connection wiring CN may correspond to a node (see the fourth node N4 in FIG. 2A or the second node N2 in FIG. 2B) at which the light emitting device LD is electrically connected to the pixel driver PDC.

The connection wiring CN may include a first connection part CE (or emission connection part) and a second connection part CD (or driver connection part). The emission connection part CE may be provided at a side of the connection wiring CN, and the driver connection part CD may be provided at another side of the connection wiring CN.

The driver connection part CD may be a portion of the connection wiring CN, which is electrically connected to the pixel driver PDC. In this embodiment, the driver connection part CD may be electrically connected to an electrode of the transistor constituting the pixel driver PDC. The driver connection part CD may be electrically connected to a drain of the sixth transistor T6 illustrated in FIG. 2A or the drain of the first transistor T1 illustrated in FIG. 2B. Accordingly, the position of the driver connection part CD may correspond to the position of the transistor TR (see FIG. 5) physically electrically connected to the connection wiring CN among the pixel drivers. The emission connection part CE may be a portion of the connection wiring CN, which is electrically connected to the light emitting device. In this embodiment, the emission connection part CE may be electrically connected to the second electrode EL2 (hereinafter referred to as a cathode) of the light emitting device.

The light emitting unit UT may include first to third connection wirings CN1, CN2, and CN3. The first connection wiring CN1 may electrically connect the light emitting device and the first pixel driver PDC1, which constitute the first emitting part EP1, to each other, the second connection wiring CN2 may electrically connect the light emitting device and the second pixel driver PDC2, which constitute the second emitting part EP2, to each other, and the third connection wiring CN3 may electrically connect the light emitting device and the third pixel driver PDC3, which constitute the third emitting part EP3, to each other.

The first to third connection wirings CN1, CN2, and CN3 may electrically connect the first to third cathodes EL2_1, EL2_2, and EL2_3 to the first to third pixel drivers PDC1, PDC2, and PDC3, respectively. The first connection wiring CN1 may include a first driver connection part CD1 (e.g., CD1a, CD1b) electrically connected to the first pixel driver PDC1 and a first emission connection part CE1 (e.g., CE1a, CE1b) electrically connected to the first cathode EL2_1. The second connection wiring CN2 may include a second driver connection part CD2 (e.g., CD2a, CD2b) electrically connected to the second pixel driver PDC2 and a second emission connection part CE2 (e.g., CE2a, CE2b) electrically connected to the second cathode EL2_2. The third connection wiring CN3 may include a third driver connection part CD3 (e.g., CD3a, CD3b) electrically connected to the third pixel driver PDC3 and a third emission connection part CE3 (e.g., CE3a, CE3b) electrically connected to the third cathode EL2_3.

The first to third driver connection parts CD1, CD2, and CD3 may be aligned in the first direction DR1. As described above, the first to third driver connection parts CD1, CD2, and CD3 may correspond to positions of the connection transistors constituting the first to third pixel drivers PDC1, PDC2, and PDC3, respectively. In a pixel, the connection transistor may be a transistor including a connection node to which the pixel driver and the light emitting device are electrically connected. For example, the connection transistor may correspond to the sixth transistor T6 of FIG. 2A or the first transistor T1 of FIG. 2B. According to an embodiment of the disclosure, regardless of the shape or size of the emitting part and the color of light emitted thereby, the shape, position, and/or arrangement of the pixel drivers of all the pixels may be simply configured to be designed.

In this embodiment, the first to third emission connection parts CE1, CE2, and CE3 may be disposed at positions that do not overlap the emitting parts EP1, EP2, and EP3 on a plane. As will be described below, since the emission connection part CE (see FIG. 5) of the connection wiring CN may be a portion at which the light emitting device LD (see FIG. 5) is electrically connected, and a tip part TP (see FIG. 5) is defined, the emission connection part CE may be provided at a position that does not overlap the light emitting opening OP-PDL. For example, the emission connection parts CE1, CE2, and CE3 may be disposed at positions spaced apart from the emitting parts EP1, EP2, and EP3 in each of the cathodes EL2_1, EL2_2, and EL2_3, and the cathodes EL2_1, EL2_2, and EL2_3 may include some areas protruding from the emitting parts EP1, EP2, and EP3 on a plane so as to be electrically connected to the connection wires CN1, CN2, and CN3 at the positions at which the emission connection parts CE1, CE2, and CE3 are disposed.

For example, the first cathode EL2_1 may include a protrusion having a shape protruding from the first emitting part EP1 at a position that does not overlap the first emitting part EP1 so as to be electrically connected to the first connection wiring CN1 at the position at which the first emission connection part CE1 is disposed, and the first emission connection part CE1 may be provided on the protrusion.

The first driver connection part CD1, which is a position at which the first pixel driver PDC1, particularly the first connection wiring CN1 is electrically connected to the transistor TR, may be defined at a position that does not overlap the first emitting part EP1 on a plane. According to this embodiment, the first connection wiring CN1 may be disposed in the first emitting part EP1, and thus, the first cathode EL2_1 and the first pixel driver PDC1 may be easily electrically connected to each other.

The third driver connection part CD3, which is a position at which the third connection wiring CN3 is electrically connected to the transistor TR of the third pixel driver PDC3, may be defined at a position that does not overlap the third emission connection part CE3 on a plane and may be disposed at a position that overlaps the third emitting part EP3. According to this embodiment, since the third cathode EL2_3 and the third pixel driver PDC3 are electrically connected through the third connection wiring CN3, in the design of the third pixel driver PDC3, restriction due to the position or shape of the third emitting part EP3 may be reduced to improve a degree of freedom of the design.

Referring again to FIG. 4A, the emitting parts in the second row Rk+1 may be constituted by the emitting parts having the shape and arrangement that are axisymmetric with respect to the axis parallel to the first direction DR1. Due to the characteristics of the shape and arrangement of the light emitting units UT11 and UT12 in the first row Rk, the light emitting units UT21 and UT22 in the second row Rk+1 may be substantially constituted by the emitting parts having a shape in which the light emitting units UT11 and UT12 are shifted in the first direction DR1. For example, the second row first column light emitting unit UT21 may be constituted by the emitting parts having the same shape as the first row second column light emitting unit UT12, and the second row second column light emitting unit UT22 may be constituted by the emitting parts having the same shape as the first row first column light emitting unit UT11.

Thus, a connection wirings CN-c disposed in the second row first column light emitting unit UT21 and connection wirings CN1b, CN2b, CN3b disposed in the first row second column light emitting unit UT12 may have a same shape and arrangement. Similarly, a connection wirings CN-d disposed in the second row second column light emitting unit UT22 and connection wirings CN1a, CN2a, CN3a disposed in the first row first column light emitting unit UT11 may have a same shape and arrangement.

Referring to FIG. 4C, the first electrode EL1 (hereinafter referred to as an anode) of the light emitting device according to an embodiment of the disclosure may be provided in common to the emitting parts EP1, EP2, and EP3. For example, the anode EL1 may be provided as a single layer that is integrated with the entire display area DA, and thus, the layer of the anode EL1 may overlap the separator SPR. As another example, the respective anodes EL1 of the light emitting devices may be provided to have independent conductive patterns spaced apart from each other and may be electrically connected to each other through another conductive layer. Thus, the patterns of the anode EL1 may be disposed so as not to overlap the separator SPR.

As described above, the first power supply voltage VDD may be applied to the anode EL1, and a common voltage may be provided to all of the emitting parts. The anode EL1 may be electrically connected to the first power line VDL (see FIG. 2A) providing the first power supply voltage VDD on the peripheral area NDA or be electrically connected to the first power line VDL on the display area DA, and is not limited to one embodiment.

Openings OP-EL1 may be defined in the anode EL1 according to this embodiment, and the openings OP-EL1 may pass through the layer of the anode EL1. The openings OP-EL1 of the layer of the anode EL1 may be disposed at a position that does not overlap the emitting parts EP and may generally be defined at a position overlapping the separator SPR. The openings OP-EL1 may facilitate discharge of a gas generated from an organic layer disposed below the anode EL1, for example, a sixth insulating layer 60 (see FIG. 5) to be described below. Thus, the gas from the organic layer disposed below the light emitting device may be sufficiently discharged during a process of manufacturing the display panel, and a rate of deterioration of the light emitting device may be reduced due to a reduction in the gas discharged from the organic layer after the manufacturing.

According to an embodiment of the disclosure, since the connection wiring is provided between the light emitting device and the pixel driver, the light emitting device may be easily electrically connected to the pixel driver even if only the shape of the cathode is changed without changing the arrangement or shape of the light emitting devices. Thus, the degree of freedom in the design for the arrangement of the pixel driver may be improved, and the surface area or resolution of the emitting part of the display panel may easily increase.

Figure 5:
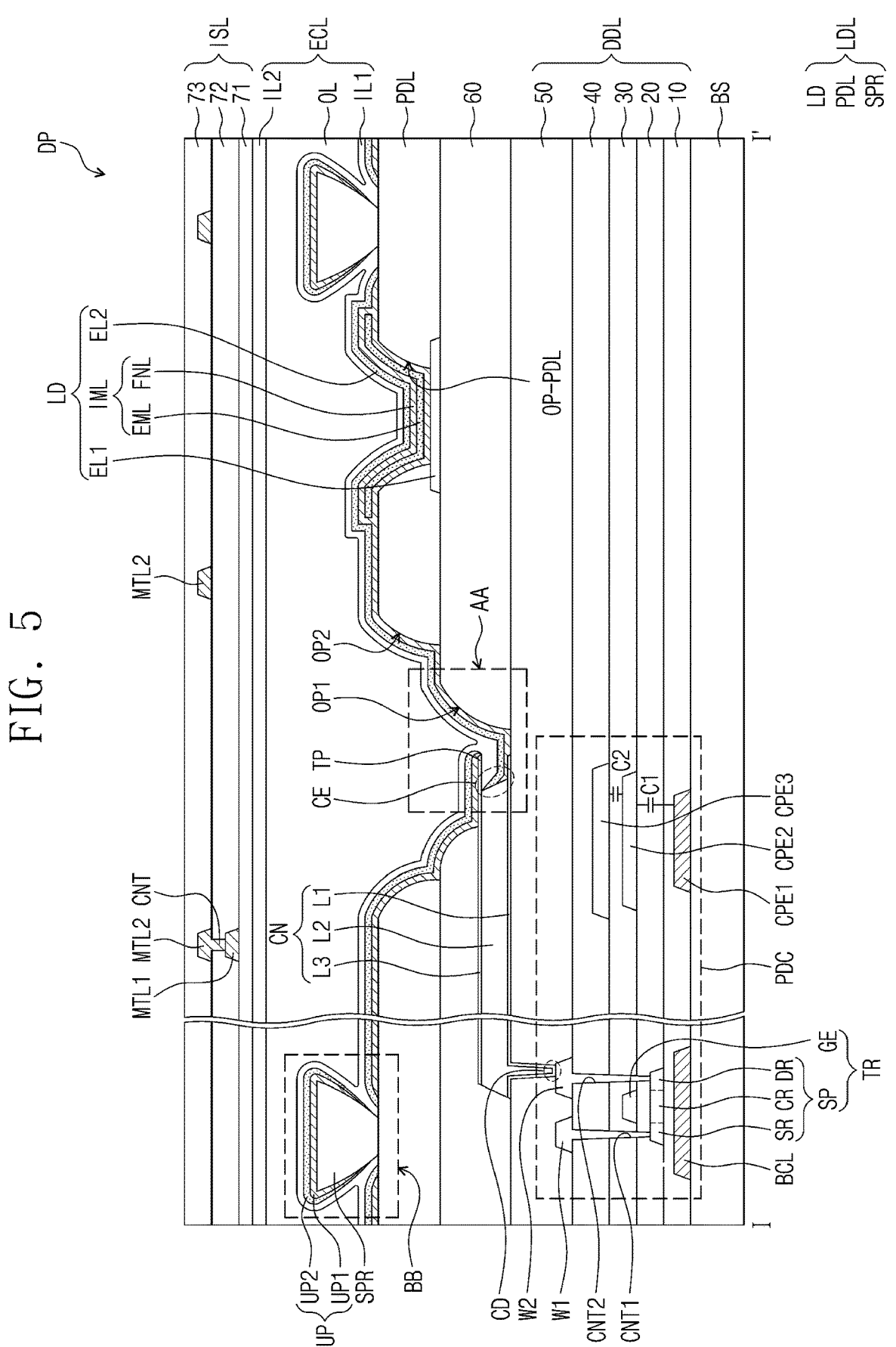
FIG. 5 is a schematic cross-sectional view of a display panel according to an embodiment of the disclosure.
Figure 6A:
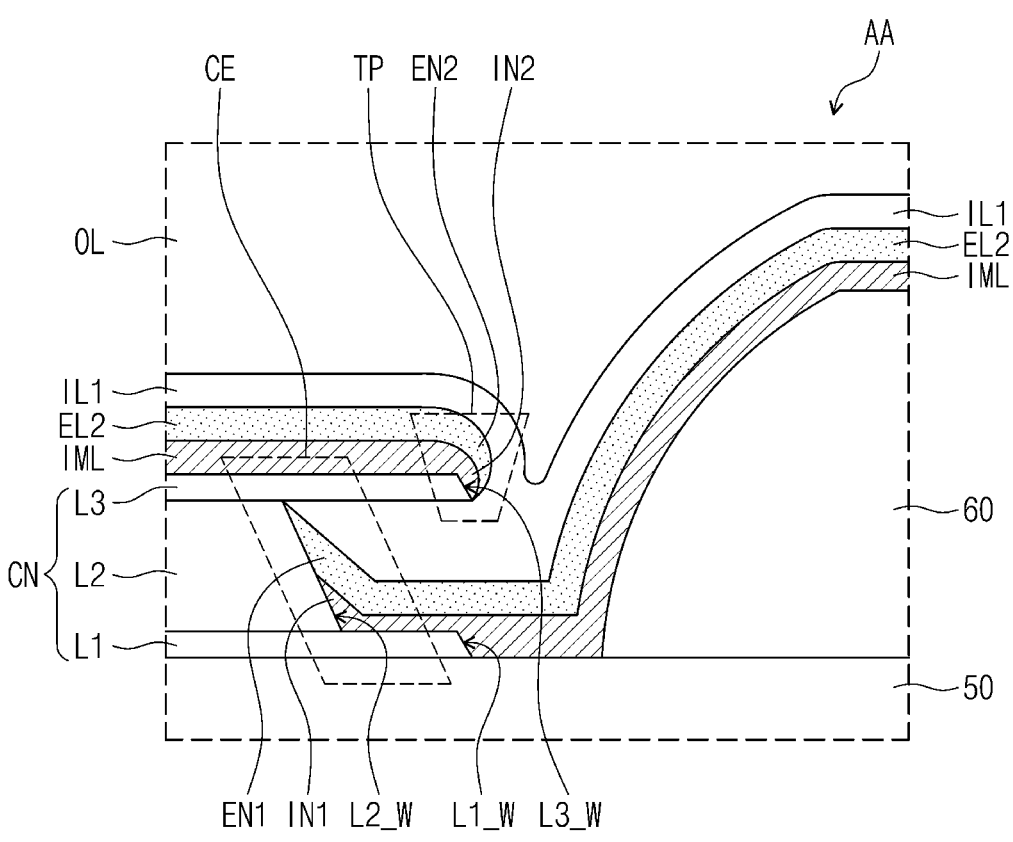
FIG. 6A is a schematic cross-sectional view illustrating a portion of an area of the display panel according to an embodiment of the disclosure.
Figure 6B:
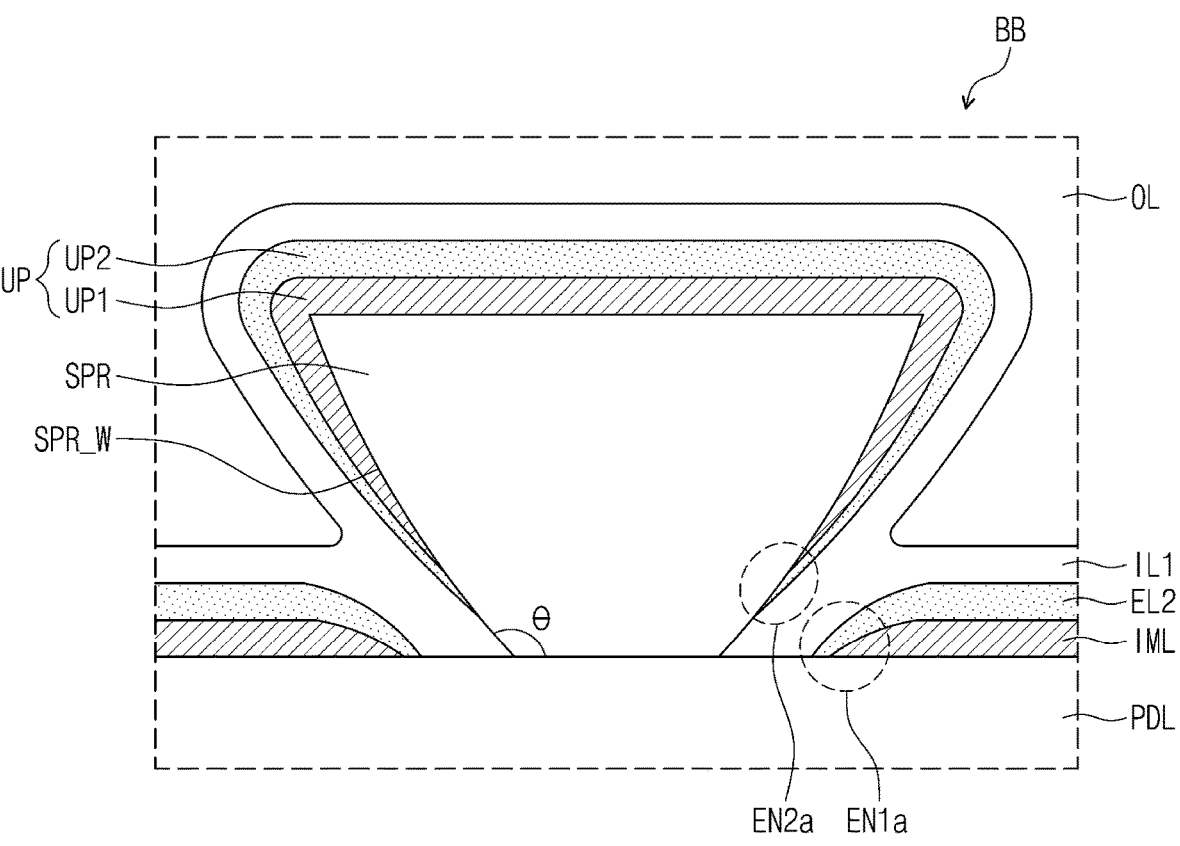
FIG. 6B is a schematic cross-sectional view illustrating a portion of an area of the display panel according to an embodiment of the disclosure.

FIG. 5 is a schematic cross-sectional view of the display panel according to an embodiment of the disclosure. FIG. 6A is a schematic cross-sectional view illustrating an area of the display panel according to an embodiment of the disclosure. FIG. 6B is a schematic cross-sectional view illustrating an area of the display panel according to an embodiment of the disclosure. FIG. 5 is a schematic cross-sectional view illustrating a portion corresponding to line I-I' of FIG. 4B. FIG. 6A illustrates a schematic enlarged cross-sectional view of area AA of FIG. 5, and FIG. 6B illustrates a schematic enlarged cross-sectional view of area BB of FIG. 5. Hereinafter, the disclosure will be described with reference to FIGS. 5 to 6B.

Referring to FIG. 5, the display panel DP according to an embodiment may include a base layer BS, a driving device layer DDL, a light emitting device layer LDL, an encapsulation layer ECL, and a sensing layer ISL. The driving device layer DDL may include insulating layers 10, 20, 30, 40, and 50 disposed on the base layer BS, and conductive patterns and semiconductor patterns disposed between the insulating layers. The conductive patterns and the semiconductor patterns may be disposed between the insulating layers to constitute the pixel driver PDC. FIG. 5 is a schematic cross-sectional view illustrating one of the areas on which an emitting part is disposed for easy explanation.

The base layer BS may be a member providing a base surface on which the pixel driver PDC is disposed. The base layer BS may be a rigid substrate or a flexible substrate capable of being bent, folded, or rolled. The base layer BS may be a glass substrate, a metal substrate, or a polymer substrate. However, the embodiment of the disclosure is not limited thereto. For example, the base layer BS may be an inorganic layer, an organic layer, or a composite layer.

The base layer BS may have a multi-layered structure. For example, the base layer SUB may include a first polymer resin layer, a silicon oxide (SiOx) layer disposed on the first polymer resin layer, an amorphous silicon (a-Si) layer disposed on the silicon oxide layer, and a second polymer resin layer disposed on the amorphous silicon layer. The silicon oxide layer and the amorphous silicon layer may be referred to as a base barrier layer.

The polymer resin layer may include a polyimide-based resin. The polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, the "XXX-based" resin means as including a functional group of "XXX".

Each of the insulating layers, the conductive layers, and the semiconductor layers disposed on the base layer BS may be formed by coating or deposition. Thereafter, the insulating layer, the semiconductor layer, and the conductive layer may be selectively patterned through photolithography processes to define a hole in the insulating layer or form a semiconductor pattern, a conductive pattern, and a signal line.

The driving device layer DDL may include first to fifth insulating layers 10, 20, 30, 40, and 50, which are sequentially laminated on the base layer BS, and a pixel driver PDC. FIG. 5 illustrates a transistor TR and two capacitors C1 and C2 of the pixel driver PDC. The transistor TR may correspond to a transistor electrically connected to the light emitting device LD through the connection wiring CN, e.g., the connection transistor electrically connected to the node (see the fourth node N4 in FIG. 2A or the second node N2 in FIG. 2B) corresponding to the cathode of the light emitting device LD, and may particularly correspond to the sixth transistor T6 of FIG. 2A or the first transistor T1 of FIG. 2B. Although not shown, other transistors constituting the pixel driver PDC and the transistor TR (hereinafter referred to as the connection transistor) illustrated in FIG. 5 may have a same structure. However, this is merely an example, and other transistors constituting the pixel driver PDC and the connection transistor TR may have different structures, and are not limited to one embodiment.

A first insulating layer 10 may be disposed on the base layer BS. The first insulating layer 10 may include an inorganic layer and/or an organic layer and have a single-layered or multilayered structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may be a single-layered silicon oxide layer. The insulating layers to be described below may be inorganic layers and/or organic layers and may have a single-layered or multi-layered structure. The inorganic layer may include at least one of the above-described materials, but is not limited thereto.

The first insulating layer 10 may cover a bottom conductive layer BCL. For example, the display panel may further include the bottom conductive layer BCL disposed to over-lap the connection transistor TR. The bottom conductive layer BCL may block an electric potential due to a polarization phenomenon of the base layer BS from affecting the connection transistor TR. The bottom conductive layer BCL may block light incident from a lower side to the connection transistor TR. At least one of an inorganic barrier layer and a buffer layer may be further disposed between the bottom conductive layer BCL and the base layer BS.

The bottom conductive layer BCL may include a reflective metal. For example, the bottom conductive layer BCL may include at least one of titanium (Ti), molybdenum (Mo), an alloy containing molybdenum, aluminum (Al), an alloy containing aluminum, aluminum nitride (AlN), tungsten (W), tungsten nitride (WN), and copper (Cu). However, the embodiments are not limited thereto.

In this embodiment, the bottom conductive layer BCL may be electrically connected to a source of the transistor TR through a source electrode pattern W1. The bottom conductive layer BCL may be synchronized with the source of the transistor TR. However, this is merely an example, and the bottom conductive layer BCL may be electrically connected to and synchronized with a gate of the transistor TR. As another example, the bottom conductive layer BCL may be electrically connected to another electrode to inde-pendently receive a constant voltage or a pulse signal. As another example, the bottom conductive layer BCL may be provided in a shape that is isolated from other conductive patterns. The bottom conductive layer BCL according to an embodiment of the disclosure may be provided in various shapes and is not limited to one embodiment.

The transistor TR may be disposed on the first insulating layer 10. The connection transistor TR may include a semiconductor pattern SP and a gate electrode GE. The semiconductor pattern SP may be disposed on the first insulating layer 10. The semiconductor pattern SP may include an oxide semiconductor. However, the oxide semi-conductor may include transparent conductive oxide TCO such as indium tin oxide (ITO), indium zinc oxide (IZO), indium gallium zinc oxide (IGZO), zinc oxide (ZnO), indium oxide ($In2O_3$), or a combination thereof. However, the embodiment of the disclosure is not limited thereto. For example, the semiconductor pattern may include amorphous silicon, low-temperature polycrystalline silicon, or polycrys-talline silicon.

The semiconductor pattern SP may include a source region SR, a drain region DE, and a channel region CR, which may be classified or determined according to a degree of conductivity. The channel region CR may be a portion overlapping the gate electrode GE on a plane. The source region SR and the drain region DR may be spaced apart from each other with the channel region CR therebetween. In case that the semiconductor pattern SP is the oxide semiconduc-tor, each of the source region SR and the drain region DR may be a reduced region. Thus, each of the source region SR and the drain region DR have a relatively high content of reducible metal when compared to the channel region CR. As another example, in case that the semiconductor pattern SP is made of polycrystalline silicon, each of the source region SR and the drain region DR may be a region doped at a high concentration.

The source region SR and the drain region DR may have conductivity relatively higher than that of the channel region CR. The source region SR may correspond to a source electrode of the connection transistor TR, and the drain region DR may correspond to a drain electrode of the connection transistor TR. As illustrated in FIG. 5, separate source electrode patterns W1 and drain electrode patterns W2 respectively electrically connected to the source region SR and the drain region DR may be further provided. Each of the separate source electrode pattern W1 and drain electrode pattern W2 may be integral with one of the lines constituting the pixel driver (see FIGS. 2A and 2B), and is not limited to one embodiment.

The second insulating layer 20 may overlap the pixels in common and may cover the semiconductor pattern SP. The second insulating layer 20 may be an inorganic layer and/or an organic layer and have a single-layered or multilayered structure. The second insulating layer 20 may include, e.g., at least one of aluminum oxide, titanium oxide, silicon oxide, silicon nitride, silicon oxynitride, zirconium oxide, and hafnium oxide. In this embodiment, the second insulat-ing layer 20 may include a single-layered silicon oxide layer.

The gate electrode GE may be disposed on the second insulating layer 20. The gate electrode GE may correspond to the gate of the connection transistor TR. The gate elec-trode GE may be disposed above the semiconductor pattern SP. However, this is merely an example, and the gate electrode GE may be disposed below the semiconductor pattern SP, and is not limited to one embodiment.

The gate electrode GE may include, e.g., at least one of titanium (Ti), silver (Ag), molybdenum (Mo), aluminum (Al), aluminum nitride (AlN), tungsten (W), tungsten nitride (WN), copper (Cu), and alloys thereof, but is not particularly limited thereto.

A third insulating layer 30 may be disposed on the gate electrode GE. The third insulating layer 30 may be an inorganic layer and/or an organic layer and have a single-layered or multilayered structure. A fourth insulating layer 40 may include, e.g., at least one of aluminum oxide, titanium oxide, silicon oxide, silicon nitride, silicon oxyni-tride, zirconium oxide, and hafnium oxide. However, the embodiments are not limited thereto.

A first capacitor electrode CPE1 and a second capacitor electrode CPE2 among the conductive patterns W1, W2, CPE1, CPE2, and CPE3 may constitute the first capacitor C1. The first capacitor electrode CPE1 and the second capacitor electrode CPE2 may be spaced apart from each other with the first insulating layer 10 and the second insulating layer 20 therebetween.

In an embodiment of the disclosure, the first capacitor electrode CPE1 and the bottom conductive layer BCL may have an integrated shape. Also, the second capacitor elec-trode CPE2 and the gate electrode GE may have an inte-grated shape.

A third capacitor electrode CPE3 may be disposed on the third insulating layer 30. The third capacitor electrode CPE3 may be spaced apart from the second capacitor electrode CPE2 with the third insulating layer 30 therebetween and may overlap the second capacitor electrode CPE2 on a plane. The third capacitor electrode CPE3 and the second capacitor electrode CPE2 may constitute the second capaci-tor C2.

A fourth insulating layer 40 may be disposed on the third insulating layer 30 and/or the third capacitor electrode CPE3. The fourth insulating layer 40 may be an inorganic layer and/or an organic layer and have a single-layered or multilayered structure. The fourth insulating layer 40 may include at least one of aluminum oxide, titanium oxide, silicon oxide, silicon nitride, silicon oxynitride, zirconium oxide, and hafnium oxide.

A source electrode pattern W1 and a drain electrode pattern W2 may be disposed on the fourth insulating layer 40. The source electrode pattern W1 may be electrically connected to the source region SR of the connection transistor TR through a first contact hole CNT1, and the source electrode pattern W1 and the source region SR of the semiconductor pattern SP may function as a source of the connection transistor TR. The drain electrode pattern W2 may be electrically connected to the drain region DR of the connection transistor TR through a second contact hole CNT2, and the drain electrode pattern W2 and the drain region DR of the and the semiconductor pattern SP may function as a drain of the connection transistor TR. A fifth insulating layer 50 may be disposed on the source electrode pattern W1 and the drain electrode pattern W2.

A connection wiring CN may be disposed on the fifth insulating layer 50. The connection wiring CN may electrically connect the pixel driver PDC to the light emitting device LD. For example, the connection wiring CN may electrically connect the connection transistor TR to the light emitting device. The connection wiring CN may be a connection node electrically connecting the pixel driver PDC to the light emitting device LD. For example, the connection wiring CN may correspond to the fourth node N4 (see FIG. 2A) illustrated in FIG. 2A or the second node N2 (see FIG. 2B) illustrated in FIG. 2B. However, this is merely an example, and if the connection wiring CN is electrically connected to the light emitting device LD, the connection wiring CN may be defined as the connection node with various elements among the elements constituting the pixel driver PDC according to the design of the pixel driver PDC.

A sixth insulating layer 60 may be disposed on the connection wiring CN. The sixth insulating layer 60 may be disposed on the fifth insulating layer 50 to cover the connection wiring CN. Each of the fifth insulating layer 50 and the sixth insulating layer 60 may be an organic layer. For example, each of the fifth insulating layer 50 and the sixth insulating layer 60 may include at least one of general-purpose polymers such as benzocyclobutene (BCB), polyimide, hexamethyldisiloxane (HMDSO), polymethylmethacrylate (PMMA), polystyrene (PS), a polymer derivative having a phenolic group, an acrylic polymer, an imide polymer, an aryl ether polymer, an amide polymer, a fluorine polymer, a p-xylene polymer, a vinyl alcohol polymer, and a combination thereof.

An opening exposing at least a portion of the connection wiring CN may be provided in the sixth insulating layer 60. The connection wiring CN may be electrically connected to the light emitting device LD through a portion exposed from the sixth insulating layer 60. For example, the connection wiring CN may electrically connect the connection transistor TR to the light emitting device LD. This will be described below in detail. In the display panel DP according to an embodiment of the disclosure, the sixth insulating layer 60 may be omitted or may be provided in plurality, and is not limited to one embodiment.

A light emitting device layer LDL may be disposed on the sixth insulating layer 60. The light emitting device layer LDL may include a pixel defining layer PDL, a light emitting device LD, and a separator SPR. The pixel defining layer PDL may be an organic layer. For example, the pixel defining layer PDL may include at least one general-purpose polymers such as benzocyclobutene (BCB), polyimide, hexamethyldisiloxane (HMDSO), polymethylmethacrylate (PMMA), polystyrene (PS), a polymer derivative having a phenolic group, an acrylic polymer, an imide polymer, an aryl ether polymer, an amide polymer, a fluorine polymer, a p-xylene polymer, a vinyl alcohol polymer, and a combination thereof.

In an embodiment, the pixel defining layer PDL may have a property of absorbing light and may have, for example, a black color. For example, the pixel defining layer PDL may include a black coloring agent. The black coloring agent may include, e.g., a black dye and/or a black pigment. The black coloring agent may include, e.g., carbon black and/or a metal such as chromium, or an oxide thereof. The pixel defining layer PDL may correspond to a light blocking pattern having light blocking properties.

An opening OP-PDL (hereinafter referred to as a light emitting opening) exposing at least a portion of the first electrode EL1 to be described below may be defined in the pixel defining layer PDL. The light emitting opening OP-PDL may be provided as light emitting openings OP-PDL that are arranged to correspond to each light emitting device. In the light emitting opening OP-PDL, all components of the light emitting device LD may be disposed to overlap each other and may be an area on which light emitted by the light emitting device LD is substantially displayed. Thus, the above-described shape of the emitting part EP (see FIG. 2) may substantially correspond to the shape of the light emitting opening OP-PDL on a plane.

The light emitting device LD may include a first electrode EL1, an intermediate layer IML, and a second electrode EL2. The first electrode EL1 may be a semi-transmissive, transmissive, or reflective electrode. According to an embodiment, the first electrode EL1 may include a reflective layer made of (or including), e.g., silver (Ag), magnesium (Mg), aluminum (Al), platinum (Pt), palladium (Pd), gold (Au), nickel (Ni), neodymium (Nd), iridium (Ir), chromium (Cr), or a combination thereof, and a transparent or translucent electrode layer disposed on the reflective layer. The transparent or translucent electrode layer may include at least one selected from the group consisting of indium tin oxide (ITO), indium zinc oxide (IZO), indium gallium zinc oxide (IGZO), zinc oxide (ZnO), indium oxide (In$_2$O$_3$), and aluminum doped zinc oxide (AZO). For example, the first electrode EL1 may include a laminated structure of ITO/Ag/ITO.

In this embodiment, the first electrode EL1 may be an anode of the light emitting device LD. For example, the first electrode EL1 may be electrically connected to the first power line VDL (see FIG. 2A), and the first power supply voltage VDD (see FIG. 2A) may be applied. The first electrode EL1 may be electrically connected to the first power line VDL in the display area DA or electrically connected to the first power line VDL in the peripheral area NDA. In the latter case, the first power line VDL may be disposed in the peripheral area NDA, and the first electrode EL1 may have a shape extending to the peripheral area NDA.

In the cross-sectional view of FIG. 5, the first electrode EL1 may overlap the light emitting opening OP-PDL and may not overlap the separator SPR, but as described above with reference to FIG. 4C, the first electrode EL1 of each of the light emitting devices may have an integrated shape and have a mesh or lattice shape in which openings are defined in some areas. For example, if a same first power supply voltage VDD is applied to the first electrode EL1 of each of the light emitting devices, the shape of the first electrode EL1 may be provided in various manners, and is not limited to one embodiment.

The intermediate layer IML may be disposed between the first electrode EL1 and the second electrode EL2. The intermediate layer IML may include an emitting layer EML and a functional layer FNL. The light emitting device LD may include an intermediate layer IML having various structures, and is not limited to one embodiment. For example, the functional layer FNL may be provided as layers or as two or more layers spaced apart from each other with the emitting layer EML therebetween. As another example, in an embodiment, the functional layer FNL may be omitted.

The emitting layer EML may include an organic light emitting material. The emitting layer EML may include an inorganic light emitting material or may be provided as a mixed layer of an organic light emitting material and an inorganic light emitting material. In this embodiment, the emitting layers EML provided in the respective adjacent emitting parts EP may include light emitting materials displaying different colors. For example, the emitting layer EML provided in each emitting part EP may provide at least one of blue, red, and green light. However, an embodiment of the disclosure is not limited thereto, and the emitting layer EML disposed on all the emitting parts EP may include a light emitting material displaying a same color. The emitting layer EML may provide blue light or white light. FIG. 5 illustrates an embodiment in which the emitting layer EML and the functional layer FNL have different shapes, but the disclosure is not limited thereto, and the emitting layer EML and the functional layer FNL may be disposed in a same shape on a plane.

The functional layer FNL may be disposed between the first electrode EL1 and the second electrode EL2. The functional layer FNL may be disposed between the first electrode EL1 and the emitting layer EML or between the second electrode EL2 and the emitting layer EML. As another example, the functional layer FNL may be disposed between the first electrode EL1 and the emitting layer EML and between the second electrode EL2 and the emitting layer EML. As illustrated in this embodiment of FIG. 5, the emitting layer EML may be inserted into the functional layer FNL. However, this is merely an example, and the functional layer FNL may include a layer disposed between the emitting layer EML and the first electrode EL1 and/or a layer disposed between the emitting layer EML and the second electrode EL2, may be provided in plurality, and is not limited to one embodiment.

The functional layer FNL may control movement of charges between the first electrode EL1 and the second electrode EL2. The functional layer FNL may include a hole injection/transport material and/or an electron injection/transport material. The functional layer FNL may include, e.g., at least one of an electron blocking layer, a hole transporting layer, a hole injection layer, a hole blocking layer, an electron transporting layer, an electron injection layer, and a charge generating layer.

The second electrode EL2 may be disposed on the intermediate layer IML. As described above, the second electrode EL2 may be electrically connected to the connection wiring CN and electrically connected to the pixel driver PDC. For example, the second electrode EL2 may be electrically connected to the connection transistor TR through the connection wiring CN.

As described above, the connection wiring CN may include a driver connection part CD and an emission connection part CE. The driver connection part CD may be a portion of the connection wiring CN, which is electrically connected to the pixel driver PDC, and a portion that is substantially electrically connected to the connection transistor TR. In this embodiment, the driver connection part CD may pass through the fifth insulating layer 50 and be electrically connected to the drain region DR of the semiconductor pattern SP through the drain electrode pattern W2. The emission connection part CE may be a portion of the connection wiring CN, which is electrically connected to the light emitting device LD. The emission connection part CE may be defined on an area exposed from the sixth insulating layer 60, and may be a portion to which the second electrode EL2 is electrically connected. A tip part TP may be defined in the emission connection part CE.

The emission connection part CE of the connection wiring CN will be described in more detail with reference to FIGS. 5 and 6A. As illustrated in FIGS. 5 and 6A, the connection wiring CN may have a three-layered structure. In detail, the connection wiring CN may include a first layer L1, a second layer L2, and a third layer L3 which are sequentially laminated each other in the third direction DR3. The second layer L2 may include a material different from that of the first layer L1. Also, the second layer L2 may include a material different from that of the third layer L3. The second layer L2 may have a relatively great thickness when compared to the first layer L1. The second layer L2 may have a relatively great thickness when compared to the third layer L3. The second layer L2 may include a highly conductive material. In an embodiment, the second layer L2 may include, e.g., aluminum (Al).

The first layer L1 may include a material having a lower etch rate than the second layer L2. For example, the first layer L1 and the second layer L2 may be made of materials having a high etching selectivity with respect to each other. In an embodiment, the first layer L1 may include titanium (Ti), and the second layer L2 may include aluminum (Al). A side surface L1_W of the first layer L1 may be defined outside a side surface L2_W of the second layer L2. For example, the emission connection part CE of the connection wiring CN may have a shape in which the side surface L1_W of the first layer L1 protrudes outward from the side surface L2_W of the second layer L2. For example, the emission connection part CE of the connection wiring CN may have a shape in which the side surface L2_W of the second layer L2 is recessed inward from the side surface L1_W of the first layer L1.

Also, the third layer L3 may include a material having a lower etch rate than the second layer L2. For example, the third layer L3 and the second layer L2 may be made of materials having a high etching selectivity with respect to each other. In an embodiment, the third layer L3 may include titanium (Ti), and the second layer L2 may include aluminum (Al). A side surface L3_W of the third layer L3 may be defined outside the side surface L2_W of the second layer L2. For example, the emission connection part CE of the connection wiring CN may have a shape in which the side surface L3_W of the third layer L3 protrudes outward from the side surface L2_W of the second layer L2. For example, the emission connection part CE of the connection wiring CN may have an undercut shape or an overhang structure, and the tip part TP of the emission connection part CE may be defined by a portion of the third layer L3 protruding further than the second layer L2.

The sixth insulating layer 60 and the pixel defining layer PDL may expose at least a portion of the tip part TP and at least a portion of the second side surface L2_W. A first opening OP1 exposing a side of the connection wiring CN may be defined in the sixth insulating layer 60, and a second opening OP2 overlapping the first opening OP1 may be defined in the pixel defining layer PDL. A planar area of the second opening OP2 may be larger than that of the first opening OP1. However, the embodiment of the disclosure is not limited thereto, and if at least a portion of the tip part TP and at least a portion of the second side surface L2_W are exposed, the planar area of the second opening OP2 may be less than or equal to that of the first opening OP1.

An intermediate layer IML may be disposed on the pixel defining layer PDL. The intermediate layer IML may also be disposed on a portion of the sixth insulating layer 60 exposed by the second opening OP2 of the pixel defining layer PDL. The intermediate layer IML may also be disposed on a portion of the connection wiring CN exposed by the first opening OP1 of the sixth insulating layer 60. As illustrated in FIG. 6A, the intermediate layer IML may include an end IN1 disposed along a top surface of the fifth insulating layer 50 and another end IN2 disposed along a top surface of the tip part TP of the connection wiring CN. For example, in a cross-sectional view, the intermediate layer IML may have a shape in which portions thereof are disconnected from each other with respect to the tip part TP in the area on which the emission connection part CE is defined. However, when viewed on a plane (or in a plan view), the intermediate layer IML may have an integrated shape connected or extended as a whole within an area (see FIG. 4) defined as a closed line by the separator SPR.

A second electrode EL2 may be disposed on the intermediate layer IML. The second electrode EL2 may also be disposed on a portion of the sixth insulating layer 60 exposed by the second opening OP2 of the pixel defining layer PDL. Also, the second electrode EL2 may be disposed on a portion of the connection wiring CN exposed by the first opening OP1 of the sixth insulating layer 60. As illustrated in FIG. 6A, the second electrode EL2 may include an end EN1 of the second electrode EL2, which is disposed along the top surface of the fifth insulating layer 50, and another end EN2 disposed along the top surface of the tip part TP of the connection wiring CN. For example, in a cross-sectional view, the second electrode EL2 may have a shape in which portions thereof are disconnected from each other with respect to the tip part TP in the area on which the emission connection part CE is defined. However, in a plan view, the second electrode EL2 may have an integrated shape connected or extended as a whole within an area (see FIG. 4) defined as a closed curve by the separator SPR.

An end EN1 of the second electrode EL2 may be disposed along the side surface L2_W of the second layer L2 so as to contact the side surface L2_W of the second layer L2. The second electrode EL2 may be disposed to contact the side surface L2_W of the second layer L2 exposed from the intermediate layer IML by the tip part TP through a difference in deposition angle between the second electrode EL2 and the intermediate layer IML. For example, the second electrode EL2 may be electrically connected to the connection wiring CN without a separate patterning process for the intermediate layer IML, and thus the light emitting device LD may be electrically connected to the pixel driver PDC through the connection wiring CN.

Also, as illustrated in this embodiment of FIG. 6A, another end IN2 of the intermediate layer IML and another end EN2 of the second electrode EL2 may cover the side surface L3_W of the third layer L3, but this is merely an example, and at least a portion of the side surface L3_W of the third layer L3 may be exposed from the another end IN2 of the intermediate layer IML and/or the another end EN2 of the second electrode EL2.

As described above, the display panel DP may include the separator SPR. The separator SPR may be disposed on the pixel defining layer PDL. In an embodiment, the second electrode EL2 and the intermediate layer IML may be provided to be commonly deposited on the pixels through an open mask. The second electrode EL2 and the intermediate layer IML may be divided by the separator SPR. As described above, the separator SPR may have a closed line shape for each emitting part, and thus the second electrode EL2 and the intermediate layer IML may have a divided shape for each emitting part. For example, the second electrode EL2 and the intermediate layer IML may be electrically independent for each adjacent pixel.

The separator SPR will be described in more detail with reference to FIGS. 5 and 6B. As illustrated in FIG. 6B, the separator SPR may have a reversely tapered shape. For example, an angle θ (hereinafter referred to as a taper angle) defined by a side surface SPR_W of the separator SPR with respect to a top surface of the pixel defining layer PDL may be an obtuse angle. However, this is merely an example, and if the separator SPR electrically disconnects the second electrode EL2 for each pixel, the taper angle θ may be set in various manners. Also, the separator SPR and the tip part TP may have a same structure. However, the embodiments are not limited thereto.

In an embodiment, the separator SPR may include an insulating material and particularly may include an organic insulating material. The separator SPR may include an inorganic insulating material, provided as a multi-layered structure of an organic insulating material and an inorganic insulating material, and include a conductive material according to an embodiment. For example, as long as the second electrode EL2 is electrically disconnected for each pixel, the type of the material of the separator SPR is not particularly limited.

A dummy layer UP may be disposed on the separator SPR. The dummy layer UP may include a first dummy layer UP1 disposed on the separator SPR and a second dummy layer UP2 disposed on the first dummy layer UP1. The first dummy layer UP1 and the intermediate layer IML may be provided through (or by) a same process and may include a same material. The second dummy layer UP2 and the second electrode EL2 may be provided through a same process and may include a same material. For example, the first dummy layer UP1 and the second dummy layer UP2 may be provided simultaneously during the formation of the intermediate layer IML and the second electrode EL2. In another embodiment, the display panel DP may not include the dummy layer UP.

As illustrated in FIG. 6B, in an embodiment, the second electrode EL2 may include a first end EN1a, and the second dummy layer UP2 may include a second end EN2a. The first end EN1a may be spaced apart from the separator SPR and disposed on the pixel defining layer PDL, and the second end EN2a may be separated from the first end EN1a and disposed on the side surface SPR_W of the separator SPR. However, FIG. 6B illustrates that the first end EN1a is spaced a distance (e.g., a predetermined or selectable distance) from the side surface SPR_W of the separator SPR, but the embodiment of the disclosure is not limited thereto. For example, as long as the first end EN1 is electrically disconnected from the second end EN2a, the first end EN1a may also contact the side surface SPR_W of the separator SPR. Even if the first end EN1a and the second end EN2a are electrically connected without being distinguished from each other, in case that a thickness of portions thereof disposed along the side surface SPR_W of the separator SPR is small so that electrical resistance is high, if the second electrode EL2 between the adjacent pixels is electrically disconnected, it is assumed that the second electrode EL2 is divided by the separator SPR.

According to an embodiment of the disclosure, even if there is no separate patterning process for the second electrode EL2 or the intermediate layer IML, the second electrode EL2 or the intermediate layer IML may not be provided on the side surface SPR_W of the separator SPR or may be provided to be thin, and thus, the second electrode EL2 or the intermediate layer IML may be divided for each pixel. If the second electrode EL2 or the intermediate layer IML are electrically disconnected between the adjacent pixels, the shape of the separator SPR may be modified in various manners, and is not limited to one embodiment.

Referring again to FIG. 5, the encapsulation layer ECL may be disposed on the light emitting device layer LDL. The encapsulation layer ECL may cover (or overlap) the light emitting device LD to cover the separator SPR. The encapsulation layer ECL may include a first inorganic layer ILL an organic layer OL, and a second inorganic layer IL2 which are sequentially laminated each other. However, the embodiment of the disclosure is not limited thereto. For example, the encapsulation layer ECL may further include inorganic layers and organic layers. The encapsulation layer ECL may be a glass substrate.

The first and second inorganic layers IL1 and IL2 may protect the light emitting device LD from moisture and oxygen outside the display panel DP, and the organic layer OL may protect the light emitting device LD from foreign substances such as particles remaining in the process of forming the first inorganic layer IL1. Each of the first and second inorganic layers IL1 and IL2 may include, e.g., at least one of a silicon nitride layer, a silicon oxynitride layer, a silicon oxide layer, a titanium oxide layer, an aluminum oxide layer, and the like. The organic layer OL may include an acryl-based organic layer, and the type of material thereof is not limited to one embodiment.

The sensing layer ISL may sense an external input. In this embodiment, the sensing layer ISL may be disposed on the encapsulation layer ECL through a continuous process. It may be expressed that the sensing layer ISL is directly disposed on the encapsulation layer ECL. "Directly disposed" may mean that no other components are disposed between the sensing layer ISL and the encapsulation layer ECL. For example, a separate adhesive member may not be disposed between the sensing layer ISL and the encapsulation layer ECL. However, this is merely an example, and in the display panel DP according to an embodiment of the disclosure, the sensing layer ISL may be separately provided and coupled to the display panel DP through an adhesive member, and is not limited to one embodiment.

The sensing layer ISL may include conductive layers and insulating layers. The conductive layers may include a first sensing conductive layer MTL1 and a second sensing conductive layer MTL2, and the insulating layers may include first to third sensing insulating layers 71, 72, and 73. However, this is merely an example, and the number of the conductive layers and the insulating layers is not limited to one embodiment.

The first to third sensing insulating layers 71, 72, and 73 may have a single-layered structure or a multi-layered structure in which layers are laminated each other in the third direction DR3. Each of the first to third sensing insulating layers 71, 72, and 73 may include an inorganic layer. The inorganic layer may include, e.g., at least one of aluminum oxide, titanium oxide, silicon oxide, silicon nitride, silicon oxynitride, zirconium oxide, and hafnium oxide. Each of the first to third sensing insulating layers 71, 72, and 73 may include an organic layer. The organic layer may include, e.g., at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The first sensing conductive layer MTL1 may be disposed between the first sensing insulating layer 71 and the second sensing insulating layer 72, and the second sensing conductive layer MTL2 may be disposed between the second sensing insulating layer 72 and the third sensing insulating layer 73. A portion of the second sensing conductive layer MTL2 may be electrically connected to the first sensing conductive layer MTL1 through a contact hole CNT defined in the second sensing insulating layer 72. Each of the first sensing conductive layer MTL1 and the second sensing conductive layer MTL2 may have a single-layered structure or a multi-layered structure in which layers are laminated each other in the third direction DR3.

The single-layered sensing conductive layer may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), or indium zinc tin oxide (IZTO). As another example, the transparent conductive layer may include a conductive polymer such as PEDOT, a metal nanowire, graphene, and the like.

The multi-layered sensing conductive layer may include metal layers. The metal layers may have, for example, a three-layered structure of titanium (Ti)/aluminum (Al)/titanium (Ti). As another example, the multilayered sensing conductive layer may include at least one metal layer and at least one transparent conductive layer.

The first sensing conductive layer MTL1 and the second sensing conductive layer MTL2 may constitute a sensor that senses an external input in the sensing layer ISL. The sensor may be driven by a capacitance method and may be driven by at least one of a mutual-capacitance method and a self-capacitance method. However, this is merely an example, and the sensor may be driven by a resistive film method, an ultrasonic method, and/or an infrared method in addition to the capacitance method, and is not limited to one embodiment.

Each of the first sensing conductive layer MTL1 and the second sensing conductive layer MTL2 may include a transparent conductive oxide or may have a metal mesh shape made of an opaque conductive material. The first sensing conductive layer MTL1 and the second sensing conductive layer MTL2 may have various materials and various shapes as long as visibility of an image displayed by the display panel DP is not deteriorated, and is not limited to an embodiment.

Figure 7:
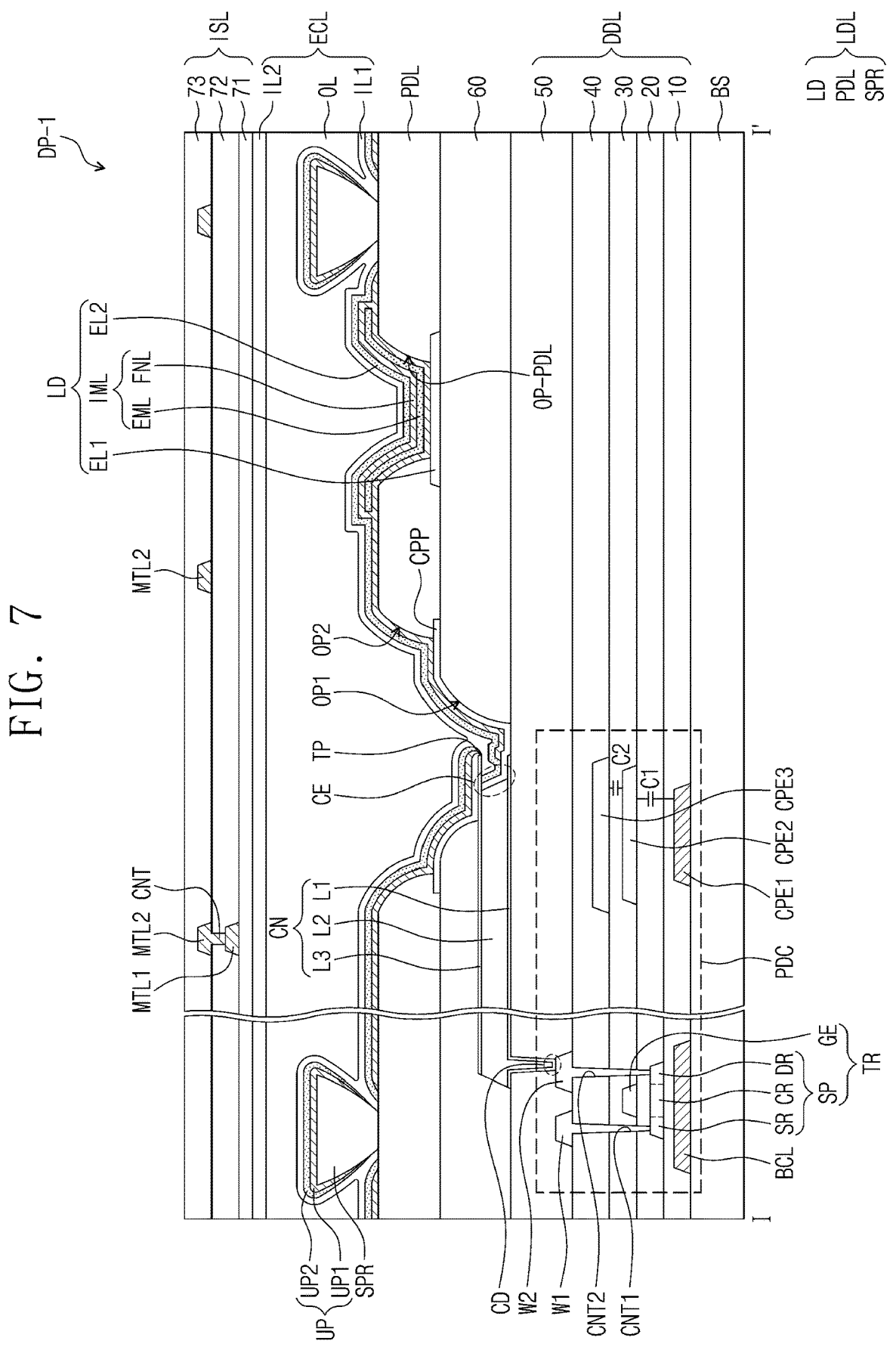
FIG. 7 is a schematic cross-sectional view of a display device according to an embodiment of the disclosure.

FIG. 7 is a schematic cross-sectional view of the display panel according to an embodiment of the disclosure. For ease of description, FIG. 7 is a schematic cross-sectional view illustrating an area corresponding to FIG. 5. Hereinafter, the same reference numeral may be given to components that are the same as those of FIGS. 1 to 6B, and their detailed descriptions will be omitted.

When compared to the display panel DP illustrated in FIG. 5, a display panel DP-1 illustrated in FIG. 7 may further include a capping pattern CPP. The capping pattern CPP may be disposed on the sixth insulating layer 60. Also, the capping pattern CPP may be disposed on a portion of the connection wiring CN exposed by the first opening OP1 of the sixth insulating layer 60. The capping pattern CPP may be disposed to overlap the connection wiring CN, and specifically, may be disposed to overlap the emission connection part CE and/or the tip part TP.

Also, as illustrated in FIG. 7, in a cross-sectional view, the capping pattern CPP may have a shape which portions thereof are disconnected from each other with respect to the tip part TP on the area where the emission connection part CE is defined. However, in a plan view, the capping pattern CPP may have an integrated shape connected or extended as a whole within an area defined as a closed line by the separator (see FIG. 4). An end of the capping pattern CPP with the portions disconnected from each other may contact the side surface of the second layer L2 of the connection wiring CN, and another end of the capping pattern CPP may be disposed on an upper portion of the third layer L3 of the connection wiring CN to cover the tip part TP.

The capping pattern CPP may include a conductive material. Thus, the second electrode EL2 may be electrically connected to the connection wiring CN through the capping pattern CPP. For example, the capping pattern CPP may contact the side surface of the second layer L2 of the connection wiring CN, and the second electrode EL2 may contact the capping pattern CPP to electrically connect all of the connection wirings CN and the second electrode EL2. The capping pattern CPP may be disposed relatively outside the second layer L2 of the connection wiring CN, and the second electrode EL2 may be electrically connected to the second layer L2 by being only electrically connected to the capping pattern CPP instead of the side surface of the second layer L2, and thus, the connection between the connection wiring CN and the second electrode E2 may be more easily performed.

Also, the capping pattern CPP may include a material having a relatively low reactivity when compared to the second layer L2 of the connection wiring CN. For example, the capping pattern CPP may include copper (Cu), silver (Ag), a transparent conductive oxide, or the like. As the side surface of the second layer L2 of the connection wiring CN is protected by the capping pattern CPP having the relatively low reactivity, oxidation of a material contained in the second layer L2 may be prevented. During an etching process of patterning the first electrode EL1, a phenomenon in which a silver (Ag) component provided in the layer of the first electrode EL1 is reduced to remain as particles causing defects may be prevented.

In an embodiment, the capping pattern CPP and the first electrode EL1 may be provided through a same process and may include a same material. However, this is merely an example, and the capping pattern CPP and the first electrode EL1 may be provided through different processes or may include different materials, and the capping pattern CPP is not limited to one embodiment.

Figure 8:
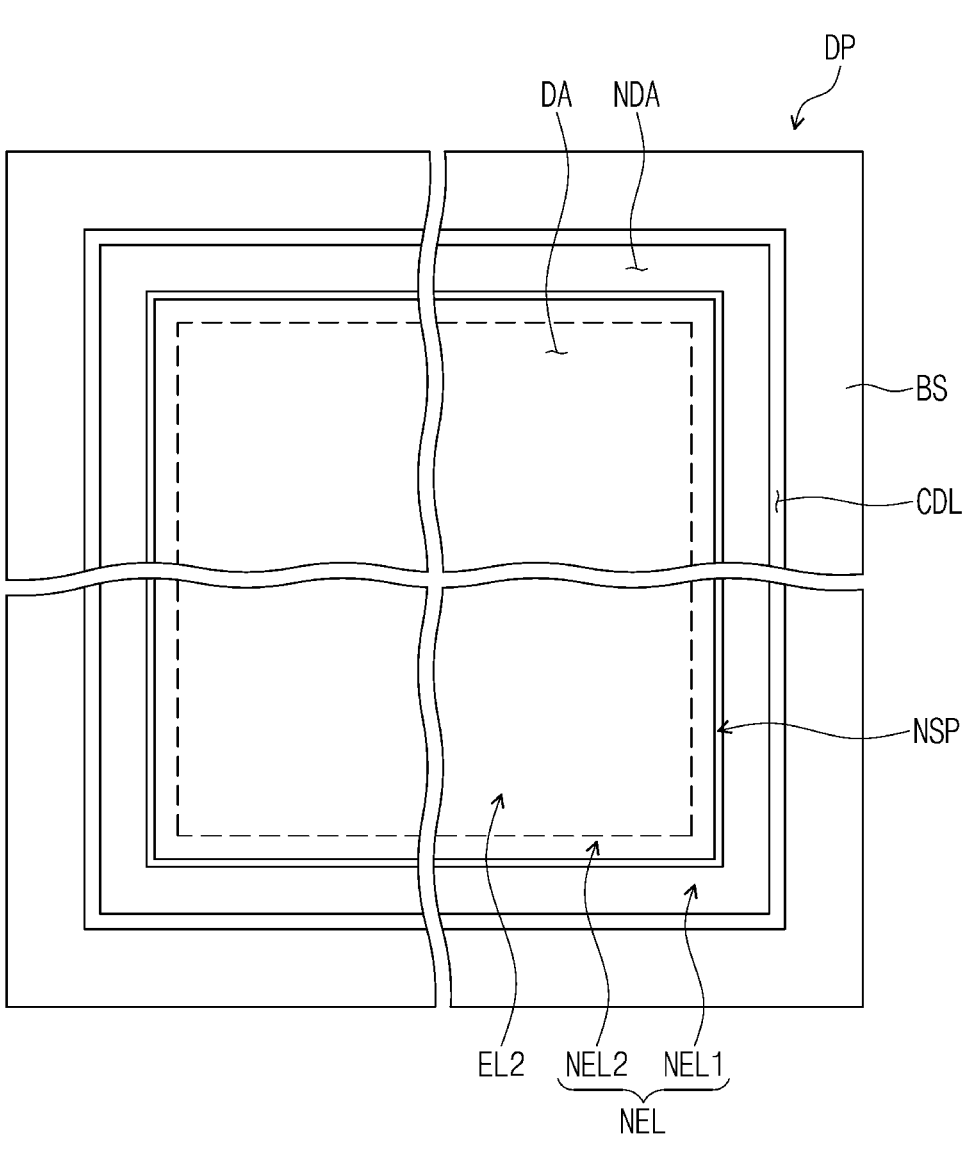
FIG. 8 is a schematic plan view of a display device according to an embodiment of the disclosure.
Figure 9:
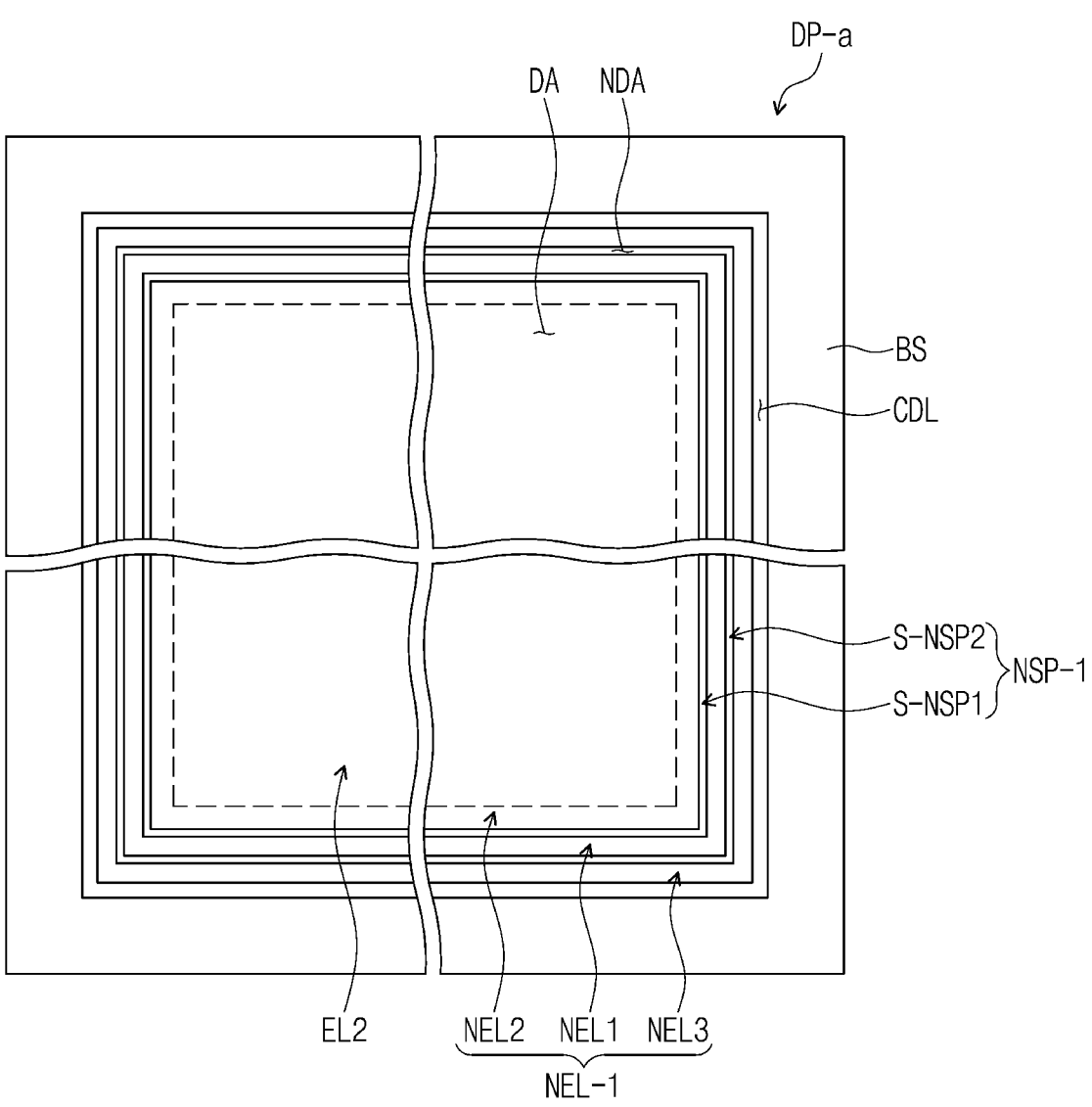
FIG. 9 is a schematic plan view of a display device according to an embodiment of the disclosure.
Figure 10:
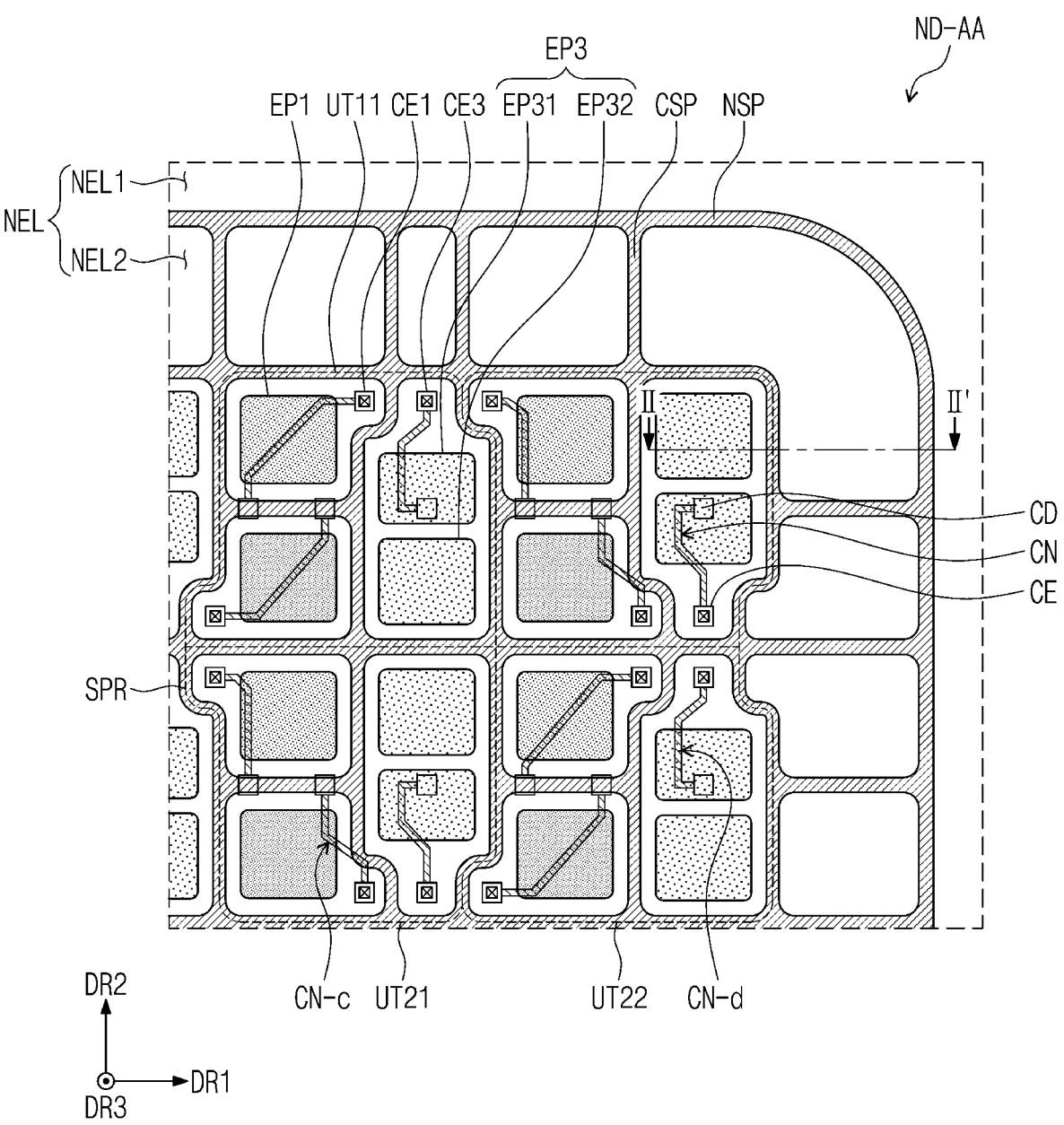
FIG. 10 is a schematic plan view illustrating a portion of the display device according to an embodiment of the disclosure.
Figure 11:
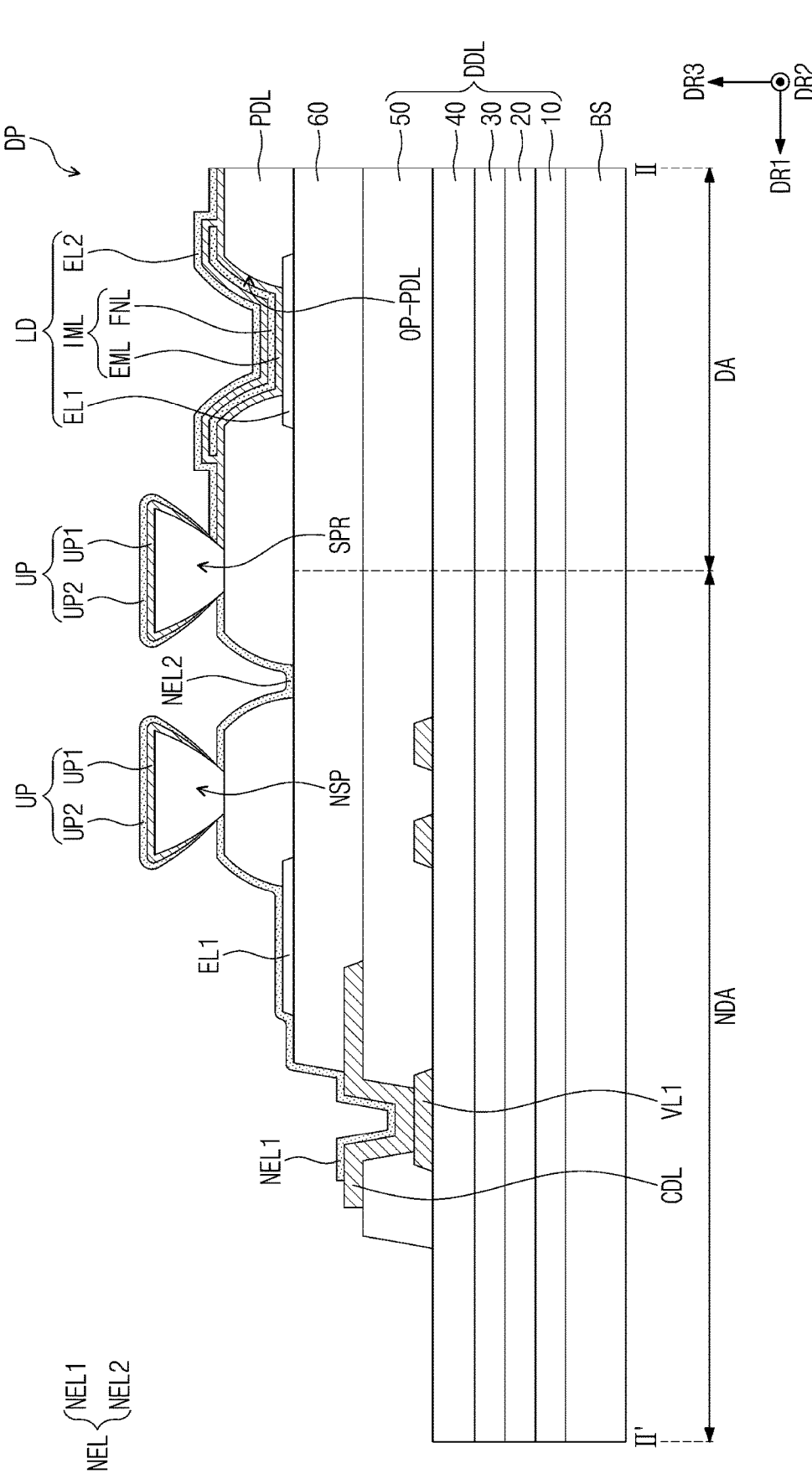
FIG. 11 is a schematic plan view illustrating a portion of the display device according to an embodiment of the disclosure.

FIGS. 8 and 9 are schematic plan views of the display panel according to an embodiment of the disclosure. FIG. 10 is a schematic plan view illustrating a portion of the display panel according to an embodiment of the disclosure. FIG. 11 is a schematic cross-sectional view illustrating a portion of the display panel according to an embodiment of the disclosure. FIGS. 8 and 9 schematically illustrate only a peripheral separator, a first peripheral upper electrode, a second peripheral upper electrode, an upper electrode, a first power supply line, and a base layer for convenience of description. FIG. 10 illustrates a portion corresponding to an area ND-AA displayed in FIG. 3A. FIG. 11 illustrates a portion taken along line II-II' of FIG. 10.

Referring to FIGS. 8 and 11, the display panel DP according to an embodiment may include a peripheral separator NSP which is disposed in the peripheral area NDA, peripheral upper electrodes NEL (e.g., including a first peripheral upper electrode NEL1 and/or a second peripheral upper electrode NEL2), an upper electrode EL2, and a first power line VDL. The peripheral separator NSP, the first peripheral upper electrode NEL1, the second peripheral upper electrode NEL2, and the first power line VDL may be disposed in the peripheral area NDA. The upper electrode EL2 may be disposed in the display area DA.

The peripheral separator NSP may be disposed to surround the display area DA. The peripheral separator NSP may have a closed-line shape surrounding the display area DA. FIG. 8 illustrates that the peripheral separator NSP has a quadrangular closed-line shape, but the embodiment is not limited thereto. For example, the peripheral separator NSP may have a closed-line shape having a circle or a rhombus shape.

The peripheral separator NSP may be an organic layer. For example, the peripheral separator NSP may include at least one general-purpose polymers such as benzocyclobutene (BCB), polyimide, hexamethyldisiloxane (HMDSO), polymethylmethacrylate (PMMA), polystyrene (PS), a polymer derivative having a phenolic group, an acrylic polymer, an imide polymer, an aryl ether polymer, an amide polymer, a fluorine polymer, a p-xylene polymer, a vinyl alcohol polymer, and a combination thereof.

The peripheral separator NSP may be disposed closer to the display area DA than the first peripheral upper electrode NEL1. The second peripheral upper electrode NEL2 may be disposed closer to the display area DA than the peripheral separator NSP. The peripheral separator NSP may be disposed between the first peripheral upper electrode NEL1 and the second peripheral upper electrode NEL2.

The first peripheral upper electrode NEL1 and the second peripheral upper electrode NEL2 may be spaced apart from each other with the peripheral separator NSP therebetween. The peripheral separator NSP may divide the first peripheral upper electrode NEL1 and the second peripheral upper electrode NEL2 disposed in the peripheral area NDA.

The first peripheral upper electrode NEL1 may be electrically connected to a power voltage pattern CDL. The first peripheral upper electrode NEL1 may directly contact and be electrically connected to the power voltage pattern CDL or may be electrically connected to the power voltage pattern CDL through another configuration. The second peripheral upper electrode NEL2 may be insulated by being divided with the first peripheral upper electrode NEL1 and the peripheral separator NSP therebetween. Thus, the second peripheral upper electrode NEL2 may be insulated from the power voltage pattern CDL.

The display panel DP according to an embodiment may further include a connection separator CSP disposed between the peripheral separator NSP and the display separator SPR. The connection separator CSP may connect the peripheral separator NSP to the display separator SPR.

The connection separator CSP may be an organic layer. For example, the connection separator CSP may include general-purpose polymers such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide polymer, an aryl ether polymer, an amide polymer, a fluorine polymer, a p-xylene polymer, a vinyl alcohol polymer, and a combination thereof.

The peripheral separator NSP, the display separator SPR, and the connection separator CSP may be made of a same material in a same process and have an integrated shape. However, this is merely an example, and the embodiment is not limited thereto, and at least one of the peripheral separator NSP, the display separator SPR, or the connection separator CSP may be provided by a process different from that for the rest.

FIG. 8 illustrates that the display panel DP includes one peripheral separator NSP, but the embodiment is not limited thereto. For example, as illustrated in FIG. 9, a display panel DP-a according to an embodiment may include a peripheral separator NSP–1 including sub-peripheral separators S-NSP1 and S-NSP2 each having a closed-line shape surrounding the display area DA. Although FIG. 9 illustrates that the peripheral separator NSP–1 includes two sub-peripheral separators, the peripheral separator NSP–1 may include three or more sub-peripheral separators. In case that the sub-peripheral separators S-NSP1 and S-NSP2 are provided, among the peripheral upper electrodes NEL–1, the first and second peripheral upper electrodes NEL1 and NEL2 other than an outermost peripheral upper electrode NEL3 may be insulated from the power voltage pattern CDL.

Referring to FIG. 11, in a cross-sectional view of the display panel DP according to an embodiment, the peripheral separator NSP may be disposed on the pixel defining layer PDL disposed in the peripheral area NDA. A second dummy layer UP2 may be disposed on the peripheral separator NSP. The second dummy layer UP2 and the upper electrode EL2 may be provided in a same process.

The first peripheral upper electrode NEL1, the second peripheral upper electrode NEL2, and the upper electrode EL2 may be made of a same material. Also, the first peripheral upper electrode NEL1, the second peripheral upper electrode NEL2, and the upper electrode EL2 may be provided through a same process.

The first peripheral upper electrode NEL1 and the second peripheral upper electrode NEL2 disposed in the peripheral area NDA may be divided by the peripheral separator NSP. The second peripheral upper electrode NEL2 may be disposed between the peripheral separator NSP and the display separator SPR.

The first peripheral upper electrode NEL1 may be electrically connected to the power voltage pattern CDL. The power voltage pattern CDL may be electrically connected to the voltage line VL1 to receive the first power supply voltage VDD (see FIG. 2A). For example, the first peripheral upper electrode NEL1 may receive the first power supply voltage VDD (see FIG. 2A).

The first peripheral upper electrode NEL1 may be electrically connected to a lower electrode EL1 on the peripheral area NDA. Thus, the lower electrode EL1 may be electrically connected to the first peripheral upper electrode NEL1, and the lower electrode EL1 may receive the first power supply voltage VDD (see FIG. 2A).

All of the lower electrodes EL1 may be electrically connected to each other. Thus, all of the lower electrodes EL1 may receive the first power supply voltage VDD (see FIG. 2A).

FIG. 11 illustrates that each of the first peripheral upper electrode NEL1 and the lower electrode EL1 receives the first power supply voltage VDD (see FIG. 2A) through the first voltage line VL1, but the embodiment of the disclosure is not limited thereto. For example, each of the first peripheral upper electrode NEL1 and the lower electrode EL1 may receive at least one of the second power supply voltage VSS (see FIG. 2A), the third power supply voltage VREF (see FIG. 2A), the fourth power supply voltage VINT1 (see FIG. 2A), the fifth power supply voltage VINT2 (see FIG. 2A), or the sixth power supply voltage VCOMP (see FIG. 2A).

The second peripheral upper electrode NEL2 may be a dummy electrode to which no voltage is applied. The second peripheral upper electrode NEL2 may function to prevent electrical connection between the upper electrode EL2 of the display area DA and the first peripheral upper electrode NEL1. For example, the second peripheral upper electrode NEL2 may function to prevent electrical connection between the upper electrode EL2 of the display area DA and the first peripheral upper electrode NEL1 even though the display separator SPR is broken. For example, since the first peripheral upper electrode NEL1 and the upper electrode EL2 are prevented from being electrically connected, the voltage applied to the first peripheral upper electrode NEL1 may not be applied to the upper electrode EL2 of the display area DA, and thus electrical reliability of the display panel DP may be improved.

The display panel according to an embodiment may include the peripheral separator so that the first peripheral upper electrode is electrically connected to the upper electrode to prevent the first power supply voltage from being applied to the upper electrode. Thus, a phenomenon in which the light emitting device is not turned on, which occurs in case that a same voltage is applied to the lower electrode and the upper electrode, may be prevented to improve the electrical reliability of the display panel.

The display panel according to the embodiment may use the N-type driving transistor to reduce the occurrence of the instantaneous afterimage and also may prevent the light emitting device from being deteriorated to reduce the occurrence of the long-term afterimage.

The display panel according to the embodiment may include the peripheral separator disposed in the peripheral area to electrically separate the first peripheral upper electrode from the second peripheral upper electrode disposed adjacent to the display area in the peripheral area. Therefore, the electrical reliability of the display panel may be improved by preventing the first peripheral upper electrode from being electrically connected to the upper electrode disposed in the display area.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display panel comprising:
   a display area and a peripheral area adjacent to the display area;
   first and second light emitting devices, each of which comprises:
   a lower electrode;
   an upper electrode disposed on the lower electrode; and
   an emitting layer disposed between the lower electrode and the upper electrode;

a first pixel comprising a first driving transistor electrically connected to the upper electrode of the first light emitting device;

a second pixel comprising a second driving transistor electrically connected to the upper electrode of the second light emitting device;

an insulating layer disposed on the first driving transistor and the second driving transistor;

a first peripheral upper electrode disposed on the insulating layer in the peripheral area;

a second peripheral upper electrode disposed on the insulating layer in the peripheral area and disposed closer to the display area than the first peripheral upper electrode;

a display separator disposed between the upper electrode of the first light emitting device and the upper electrode of the second light emitting device; and a peripheral separator disposed between the first peripheral upper electrode and the second peripheral upper electrode.

2. The display panel of claim 1, wherein the peripheral separator has a closed-line shape that surrounds the display area in a plan view.

3. The display panel of claim 2, wherein the peripheral separator comprises a plurality of sub-peripheral separators, each of which has a closed-line shape that surrounds the display area in a plan view.

4. The display panel of claim 1, further comprising:

a connection separator disposed between the display separator and the peripheral separator to connect the display separator to the peripheral separator.

5. The display panel of claim 1, further comprising:

a connection wiring disposed below the insulating layer to electrically connect the first driving transistor of the first pixel to the upper electrode of the first light emitting device.

6. The display panel of claim 5, further comprising:

a lower insulating layer disposed between the first driving transistor of the first pixel and the connection wiring, wherein the first driving transistor of the first pixel and the connection wiring are electrically connected to each other through a contact hole passing through the lower insulating layer.

7. The display panel of claim 5, wherein the upper electrode of the first light emitting device is electrically connected to the connection wiring through an opening defined in the insulating layer, and the connection wiring comprises:

a first layer;

a second layer disposed on the first layer; and a third layer disposed on the second layer, the first and third layers comprising a same material, an edge of each of the first and the third layers protrudes more than an edge of the second layer, and the upper electrode of the first light emitting device is in contact with a side surface of the second layer of the connection wiring.

8. The display panel of claim 1, wherein the lower electrode is electrically connected to the first peripheral upper electrode.

9. The display panel of claim 1, wherein the lower electrode of the first light emitting device and the lower electrode of the second light emitting device are electrically connected to each other.

10. The display panel of claim 1, further comprising:

a power line disposed in the peripheral area, wherein the power line is electrically connected to the lower electrode through the first peripheral upper electrode.

11. A display panel comprising:

a display area and a peripheral area adjacent to the display area;

an insulating layer;

a plurality of light emitting devices, each of which comprises:

a lower electrode on the insulating layer;

an upper electrode disposed on the lower electrode; and an emitting layer disposed between the lower electrode and the upper electrode;

a plurality of driving transistors disposed below the insulating layer;

a plurality of connection wirings which are disposed between the plurality of driving transistors and the insulating layer to electrically connect each of the plurality of light emitting devices to each of the plurality of driving transistors and each of which comprises:

a circuit connection part electrically connected to the plurality of driving transistors; and an emission connection part electrically connected to the upper electrode;

a first peripheral upper electrode disposed on the insulating layer in the peripheral area;

a peripheral separator disposed on the insulating layer in the peripheral area and disposed closer to the display area than the first peripheral upper electrode; and a second peripheral upper electrode disposed on the insulating layer in the peripheral area and disposed to be spaced apart from the first peripheral upper electrode with the peripheral separator therebetween.

12. The display panel of claim 11, wherein the first peripheral upper electrode is electrically connected to the lower electrode.

13. The display panel of claim 11, wherein the peripheral separator has a closed-line shape that surrounds the display area in a plan view.

14. The display panel of claim 13, wherein the peripheral separator comprises a plurality of sub-peripheral separators, each of which has a closed-line shape that surrounds the display area in a plan view.

15. The display panel of claim 11, wherein the insulating layer is disposed between the upper electrode and the connection wiring, and an opening is defined in the insulating layer, the connection wiring comprises:

a first layer;

a second layer disposed on the first layer; and a third layer disposed on the second layer, the first and third layers comprising a same material, an edge of each of the first and the third layers protrudes more than an edge of the second layer, and the upper electrode is in contact with a side surface of the second layer of the connection wiring.

16. The display panel of claim 11, further comprising:

a power line disposed in the peripheral area, wherein the power line is electrically connected to the lower electrode through the first peripheral upper electrode.

17. An electronic apparatus comprising:

a display area and a peripheral area adjacent to the display area;

an insulating layer;

a plurality of light emitting devices, each of which comprises:

a lower electrode on the insulating layer;

an upper electrode disposed on the lower electrode; and an emitting layer disposed between the lower electrode and the upper electrode and which are disposed in the display area;

a plurality of transistors electrically connected to each of the plurality of light emitting devices through the upper electrode and disposed below the insulating layer;

a first peripheral upper electrode disposed on the insulating layer in the peripheral area and electrically connected to the lower electrode;

a second peripheral upper electrode disposed on the insulating layer in the peripheral area and disposed closer to the display area than the first peripheral upper electrode; and a peripheral separator disposed between the first peripheral upper electrode and the second peripheral upper electrode on the insulating layer to divide the first peripheral upper electrode and the second peripheral upper electrode.

18. The electronic apparatus of claim 17, wherein the peripheral separator has a closed-line shape that surrounds the display area in a plan view.

19. The electronic apparatus of claim 17, wherein the peripheral separator comprises a plurality of sub-peripheral separators, each of which has a closed-line shape that surrounds the display area in a plan view.

20. The electronic apparatus of claim 17, further comprising:

a display separator disposed between the upper electrodes adjacent to each other.

21. The electronic apparatus of claim 20, further comprising:

a connection separator disposed between the display separator and the peripheral separator to connect the display separator to the peripheral separator.

22. The electronic apparatus of claim 17, further comprising:

a power line disposed in the peripheral area, wherein the power line is electrically connected to the lower electrode through the first peripheral upper electrode.

* * * * *